(12) United States Patent
Lee et al.

(10) Patent No.: US 10,886,268 B2
(45) Date of Patent: Jan. 5, 2021

(54) METHOD OF MANUFACTURING A SEMICONDUCTOR DEVICE WITH SEPARATED MERGED SOURCE/DRAIN STRUCTURE

(71) Applicant: TAIWAN SEMICONDUCTOR MANUFACTURING CO., LTD., Hsinchu (TW)

(72) Inventors: Tung Ying Lee, Hsinchu (TW); Chih Chieh Yeh, Taipei (TW); Tsung-Lin Lee, Hsinchu (TW); Yee-Chia Yeo, Hsinchu (TW); Meng-Hsuan Hsiao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 15 days.

(21) Appl. No.: 15/429,844

(22) Filed: Feb. 10, 2017

(65) Prior Publication Data
US 2018/0151564 A1 May 31, 2018

Related U.S. Application Data

(60) Provisional application No. 62/427,432, filed on Nov. 29, 2016.

(51) Int. Cl.
*H01L 29/78* (2006.01)
*H01L 29/36* (2006.01)
(Continued)

(52) U.S. Cl.
CPC .. *H01L 27/0886* (2013.01); *H01L 21/823431* (2013.01); *H01L 21/823468* (2013.01);
(Continued)

(58) Field of Classification Search
None
See application file for complete search history.

(56) References Cited

U.S. PATENT DOCUMENTS 9,318,581 B1 4/2016 Guo et al.
9,455,331 B1 9/2016 Cai et al.
(Continued)

FOREIGN PATENT DOCUMENTS

DE 10 2012 106 904 B4 2/2015
KR 10-1581153 B1 12/2015
(Continued)

OTHER PUBLICATIONS

German Search Report dated Jul. 17, 2017 issued in German Patent Application No. 10 2017 103 419.6.
(Continued)

*Primary Examiner* — Joseph C. Nicely
*Assistant Examiner* — Lamont B Koo
(74) *Attorney, Agent, or Firm* — McDermott Will & Emery LLP

(57) ABSTRACT

In a method of forming a semiconductor device including a fin field effect transistor (FinFET), a sacrificial layer is formed over a source/drain structure of a FinFET structure and an isolation insulating layer. A mask pattern is formed over the sacrificial layer. The sacrificial layer and the source/drain structure are patterned by using the mask pattern as an etching mask, thereby forming openings adjacent to the patterned sacrificial layer and source/drain structure. A dielectric layer is formed in the openings. After the dielectric layer is formed, the patterned sacrificial layer is removed to form a contact opening over the patterned source/drain structure. A conductive layer is formed in the contact opening.

20 Claims, 25 Drawing Sheets

(51) Int. Cl.
  *H01L 29/45* (2006.01)
  *H01L 27/088* (2006.01)
  *H01L 29/66* (2006.01)
  *H01L 29/417* (2006.01)
  *H01L 21/8234* (2006.01)

(52) U.S. Cl.
  CPC .......... *H01L 21/823481* (2013.01); *H01L 29/41791* (2013.01); *H01L 29/66545* (2013.01); *H01L 29/66795* (2013.01); *H01L 29/785* (2013.01); *H01L 21/823418* (2013.01); *H01L 21/823475* (2013.01)

(56) References Cited

U.S. PATENT DOCUMENTS

| | | | | |
|---|---|---|---|---|
| 2009/0114903 | A1* | 5/2009 | Kalburge | B82Y 10/00 257/24 |
| 2009/0280641 | A1* | 11/2009 | Kang | H01L 21/28518 438/653 |
| 2011/0121273 | A1* | 5/2011 | Jo | B82Y 10/00 257/40 |
| 2012/0261829 | A1* | 10/2012 | Lin | H01L 21/76814 257/774 |
| 2013/0050176 | A1 | 2/2013 | Kim et al. | |
| 2013/0309837 | A1 | 11/2013 | Chang et al. | |
| 2013/0341704 | A1* | 12/2013 | Rachmady | H01L 29/66545 257/327 |
| 2014/0021538 | A1* | 1/2014 | Bangsaruntip | H01L 29/66795 257/331 |
| 2014/0124842 | A1* | 5/2014 | Wang | H01L 23/485 257/288 |
| 2014/0134814 | A1* | 5/2014 | Wong | H01L 21/823418 438/283 |
| 2014/0225065 | A1* | 8/2014 | Rachmady | H01L 29/42392 257/24 |
| 2015/0318399 | A1 | 11/2015 | Jeong et al. | |
| 2015/0380314 | A1 | 12/2015 | Chan et al. | |
| 2016/0190136 | A1 | 6/2016 | Peng et al. | |
| 2016/0293697 | A1 | 10/2016 | Kim et al. | |
| 2016/0293717 | A1* | 10/2016 | Kim | H01L 29/41791 |
| 2016/0315172 | A1 | 10/2016 | Wu et al. | |
| 2017/0012042 | A1* | 1/2017 | Cai | H01L 29/6656 |
| 2017/0018463 | A1* | 1/2017 | Bu | H01L 21/823871 |
| 2017/0084722 | A1* | 3/2017 | Lu | H01L 29/785 |
| 2017/0330834 | A1* | 11/2017 | Basker | H01L 23/535 |
| 2018/0005903 | A1* | 1/2018 | Basker | H01L 21/823871 |
| 2018/0122800 | A1 | 5/2018 | Cheng et al. | |

FOREIGN PATENT DOCUMENTS

| | | |
|---|---|---|
| TW | 201030820 A | 8/2010 |
| TW | 201436233 A | 9/2014 |

OTHER PUBLICATIONS

Notification of Reasons for Refusal issued in corresponding Korean Patent Application No. 10-2017-0060358, dated Apr. 19, 2018.
Office Action issued in U.S. Appl. No. 16/049,059, dated Jul. 31, 2019.
Non-Final Office Action issued in related U.S. Appl. No. 16/049,059, dated Mar. 19, 2020.

* cited by examiner

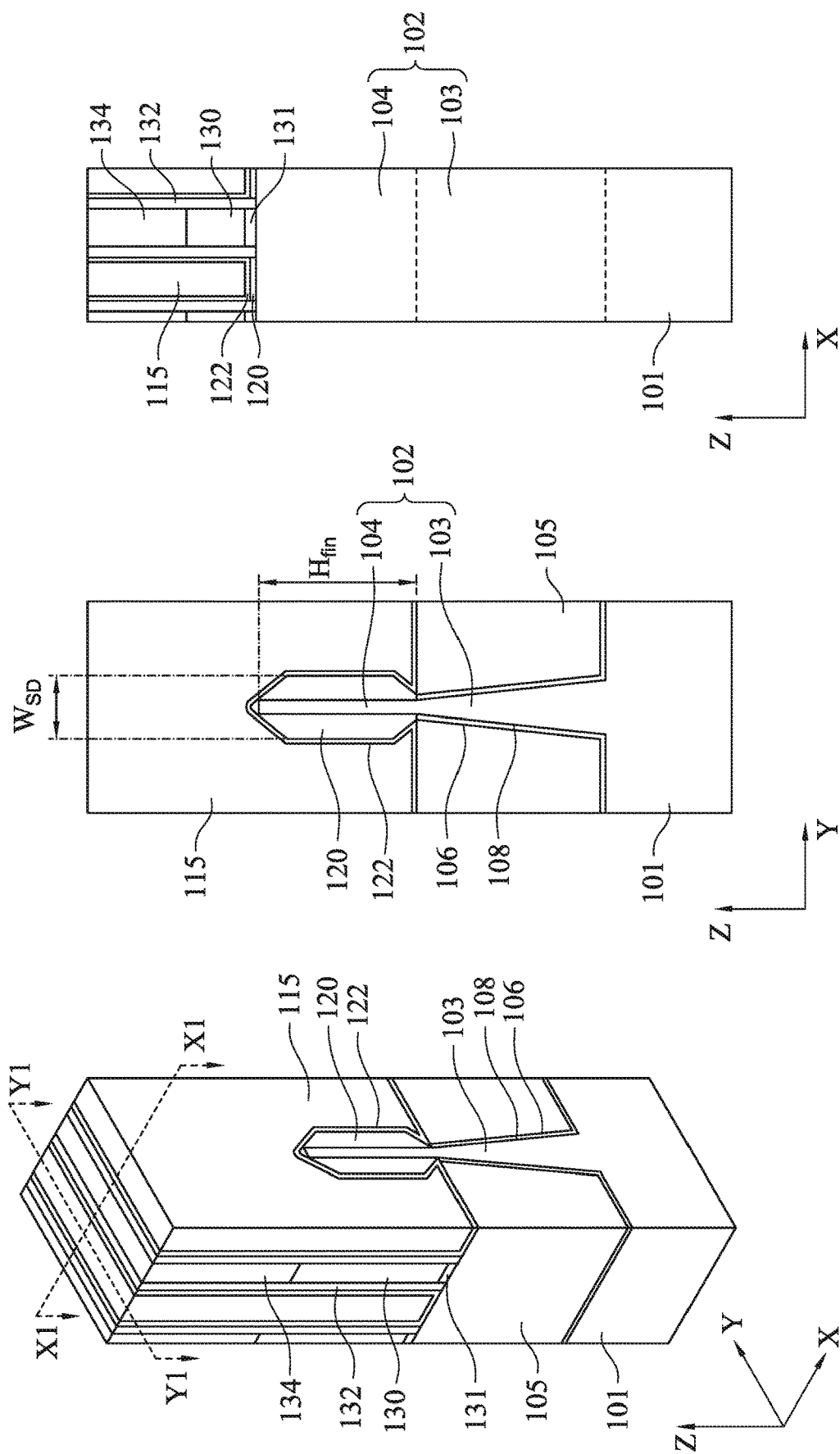

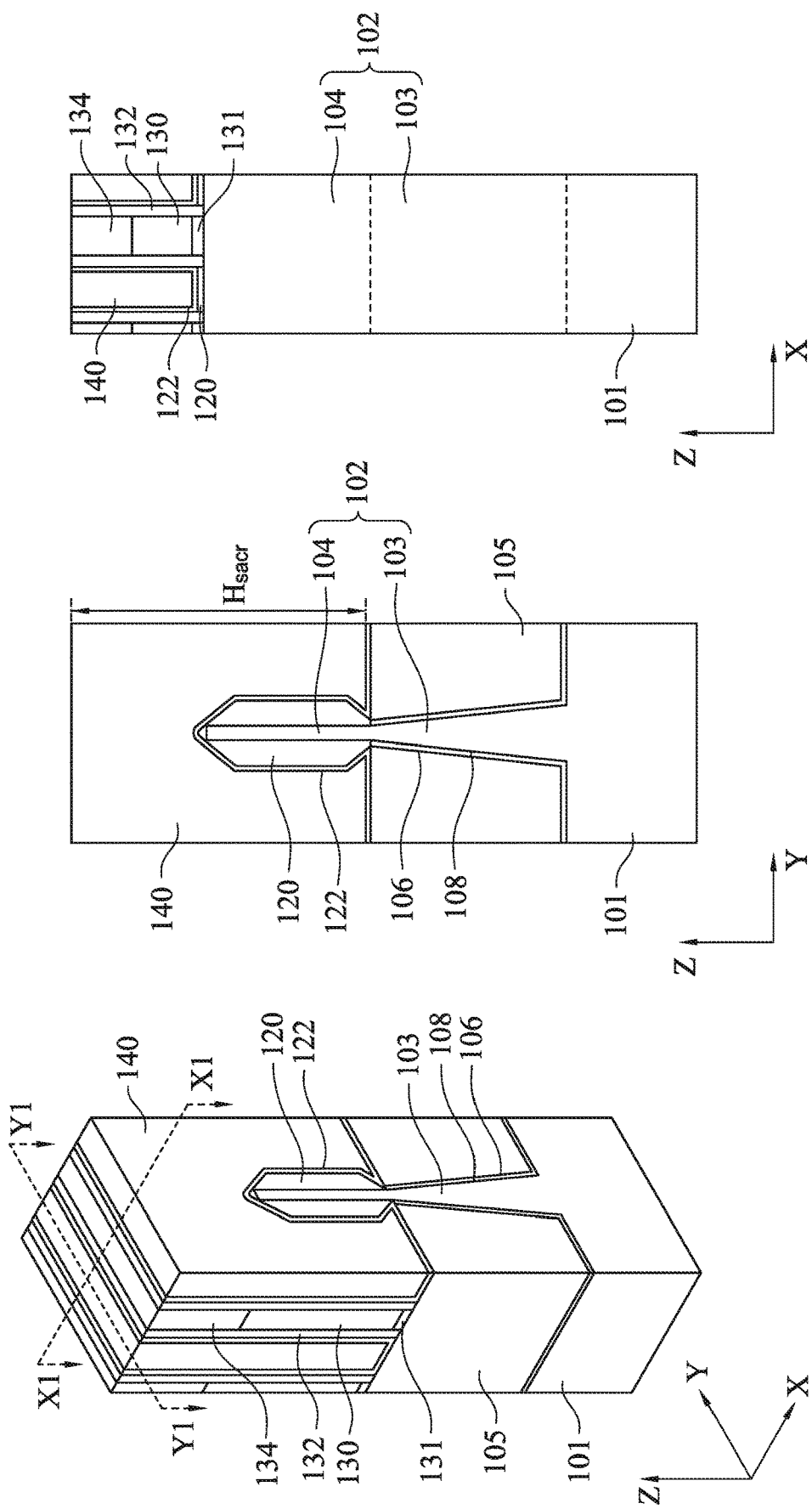

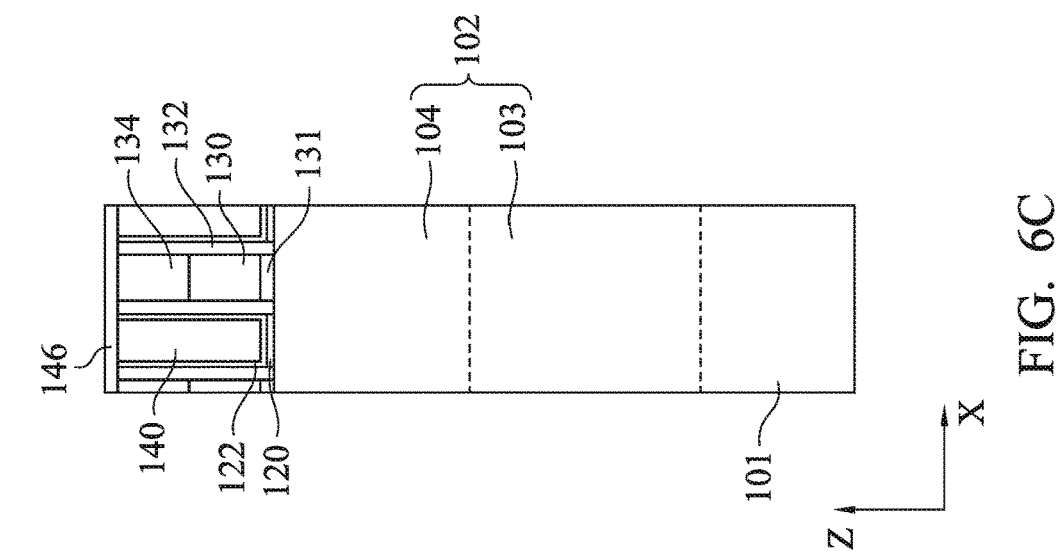
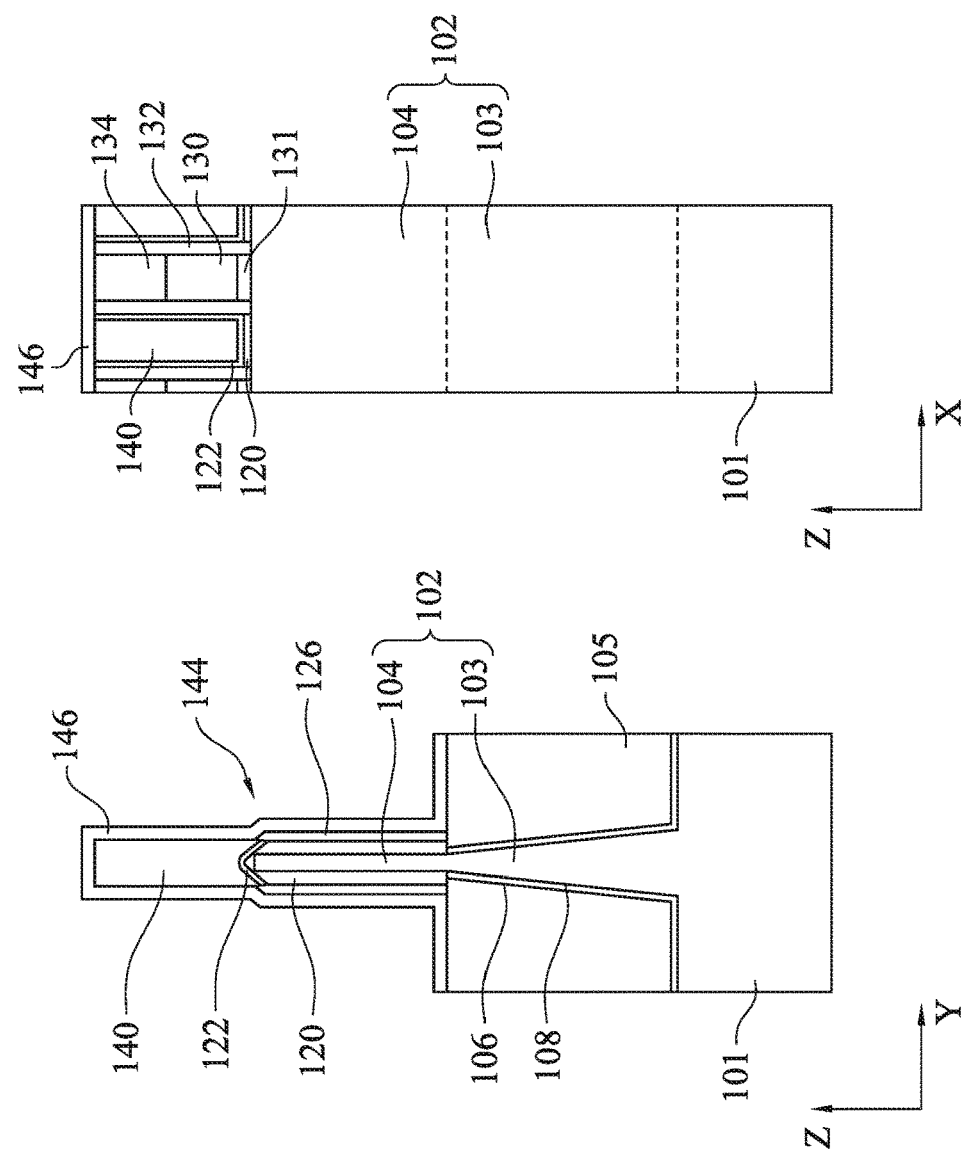
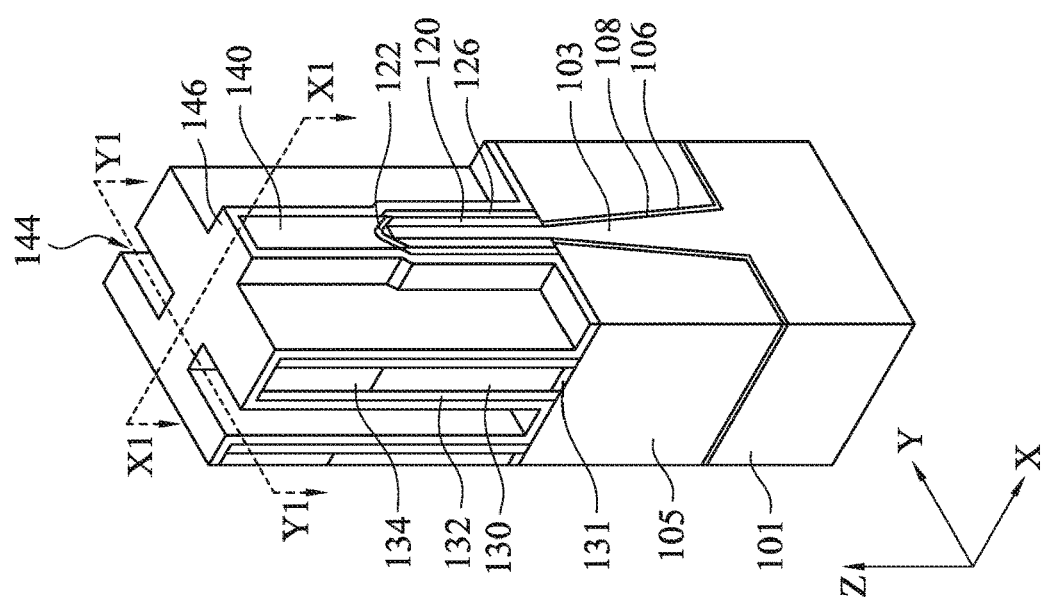
FIG. 6C
FIG. 6B
FIG. 6A

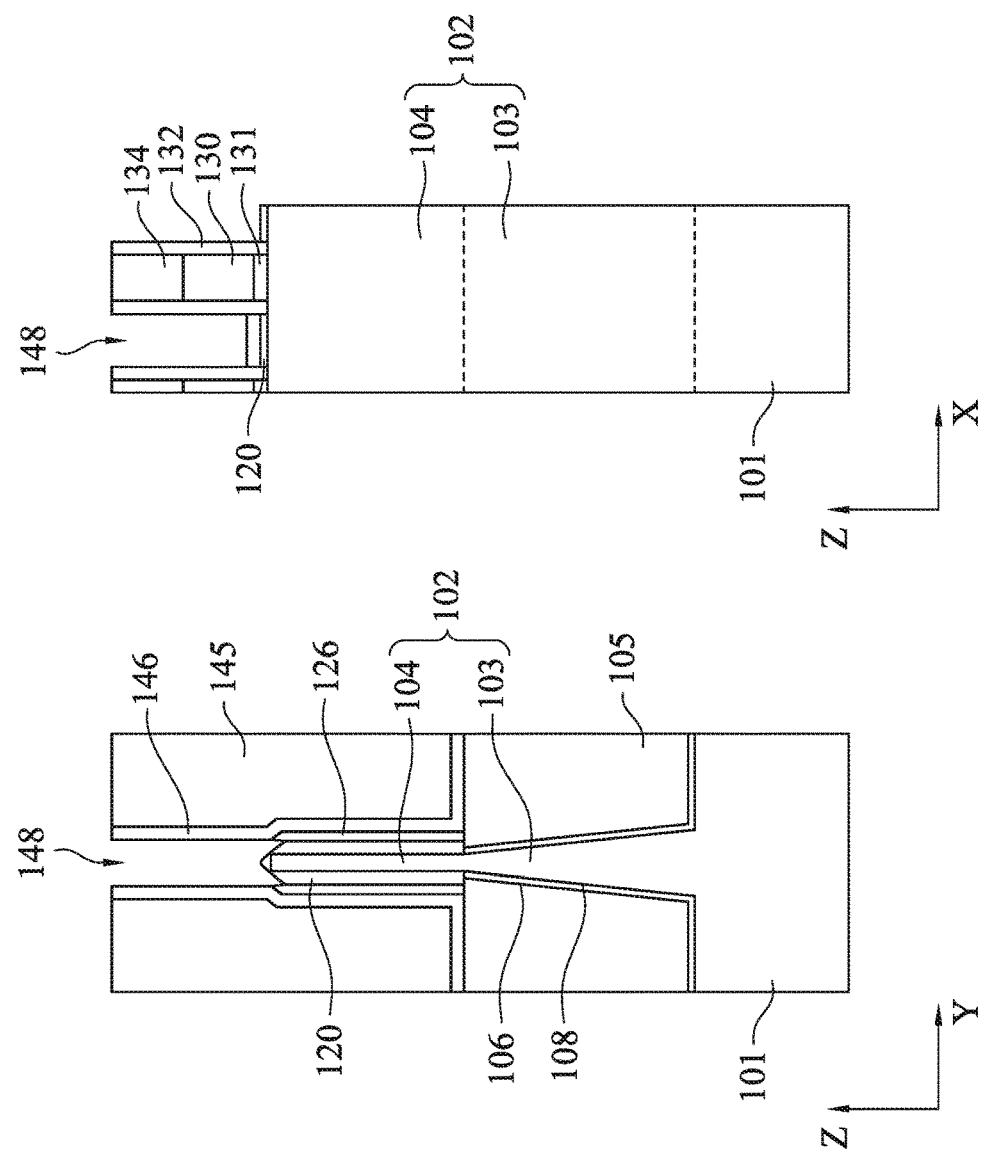
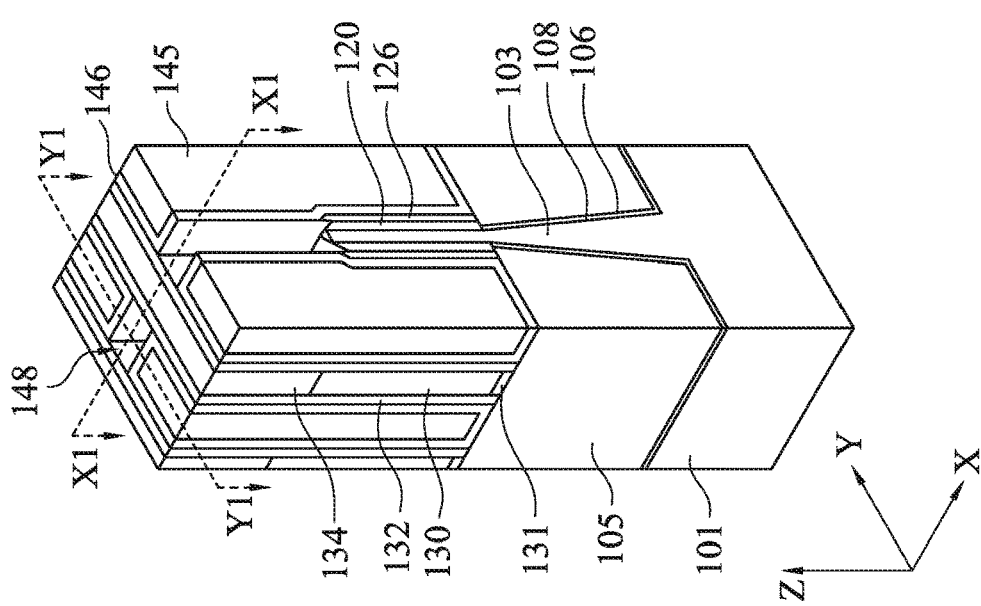
FIG. 8A    FIG. 8B    FIG. 8C

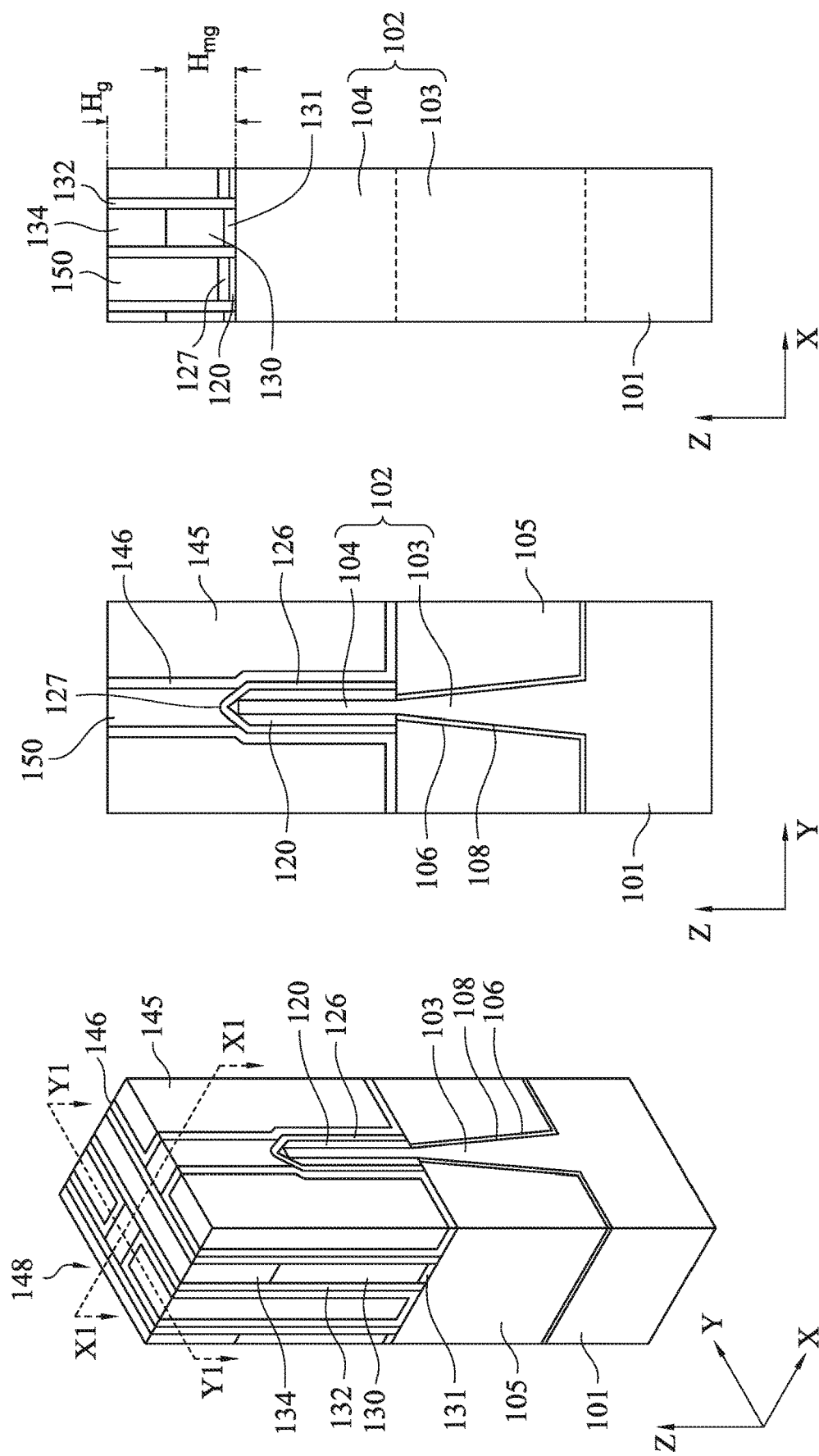

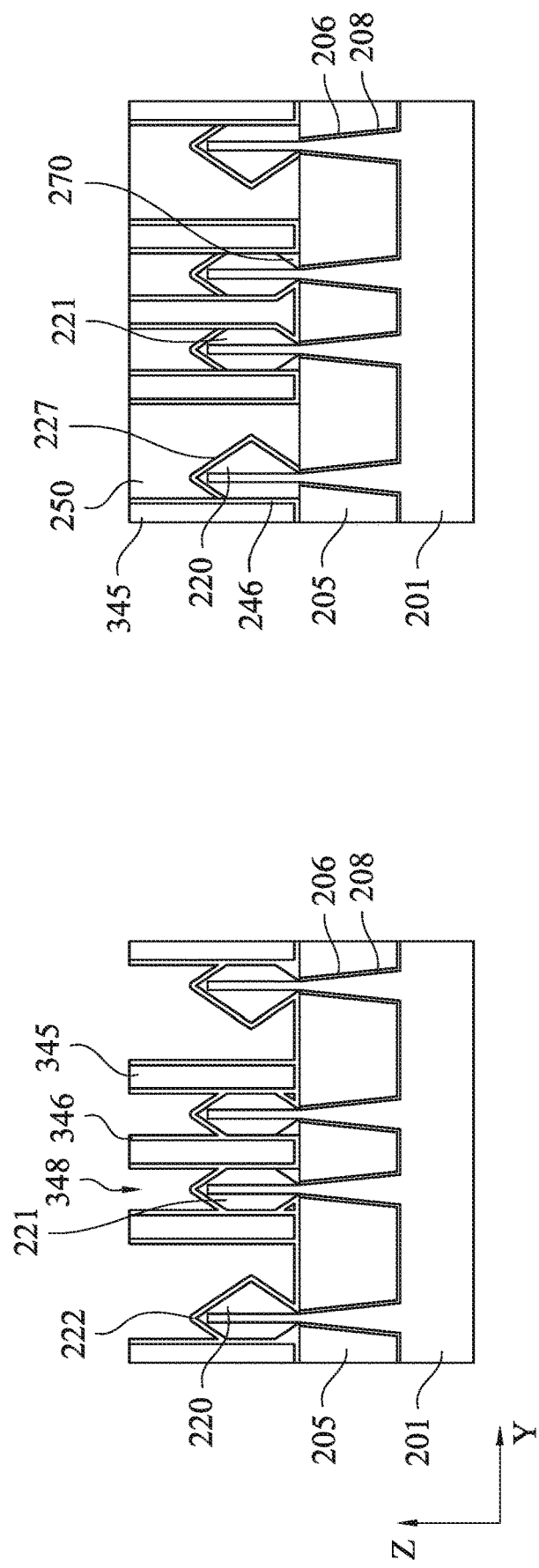

US 10,886,268 B2

METHOD OF MANUFACTURING A SEMICONDUCTOR DEVICE WITH SEPARATED MERGED SOURCE/DRAIN STRUCTURE

CROSS-REFERENCE TO RELATED APPLICATIONS

This application claims priority to U.S. Provisional Patent Application 62/427,432 filed Nov. 29, 2016, the entire disclosure of which is incorporated herein by reference.

TECHNICAL FIELD

The disclosure relates to method of manufacturing semiconductor integrated circuits, and more particularly to method of manufacturing semiconductor devices including fin field effect transistors (FinFETs), and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate one of the various stages of a semiconductor device fabrication process in accordance with some embodiments of the present disclosure.

FIGS. 3A-3C illustrate one of the various stages of a semiconductor device fabrication process in accordance with some embodiments of the present disclosure.

FIGS. 6A-6C illustrate one of the various stages of a semiconductor device fabrication process in accordance with some embodiments of the present disclosure.

FIGS. 8A-8C illustrate one of the various stages of a semiconductor device fabrication process in accordance with some embodiments of the present disclosure.

FIGS. 9A-9C illustrate one of the various stages of a semiconductor device fabrication process in accordance with some embodiments of the present disclosure.

FIG. 27 illustrates one of the various stages of a semiconductor device fabrication process in accordance with one or more embodiments of the present disclosure.

FIG. 28 illustrates one of the various stages of a semiconductor device fabrication process in accordance with one or more embodiments of the present disclosure.

DETAILED DESCRIPTION

Figures 2A, 2B, 2C:
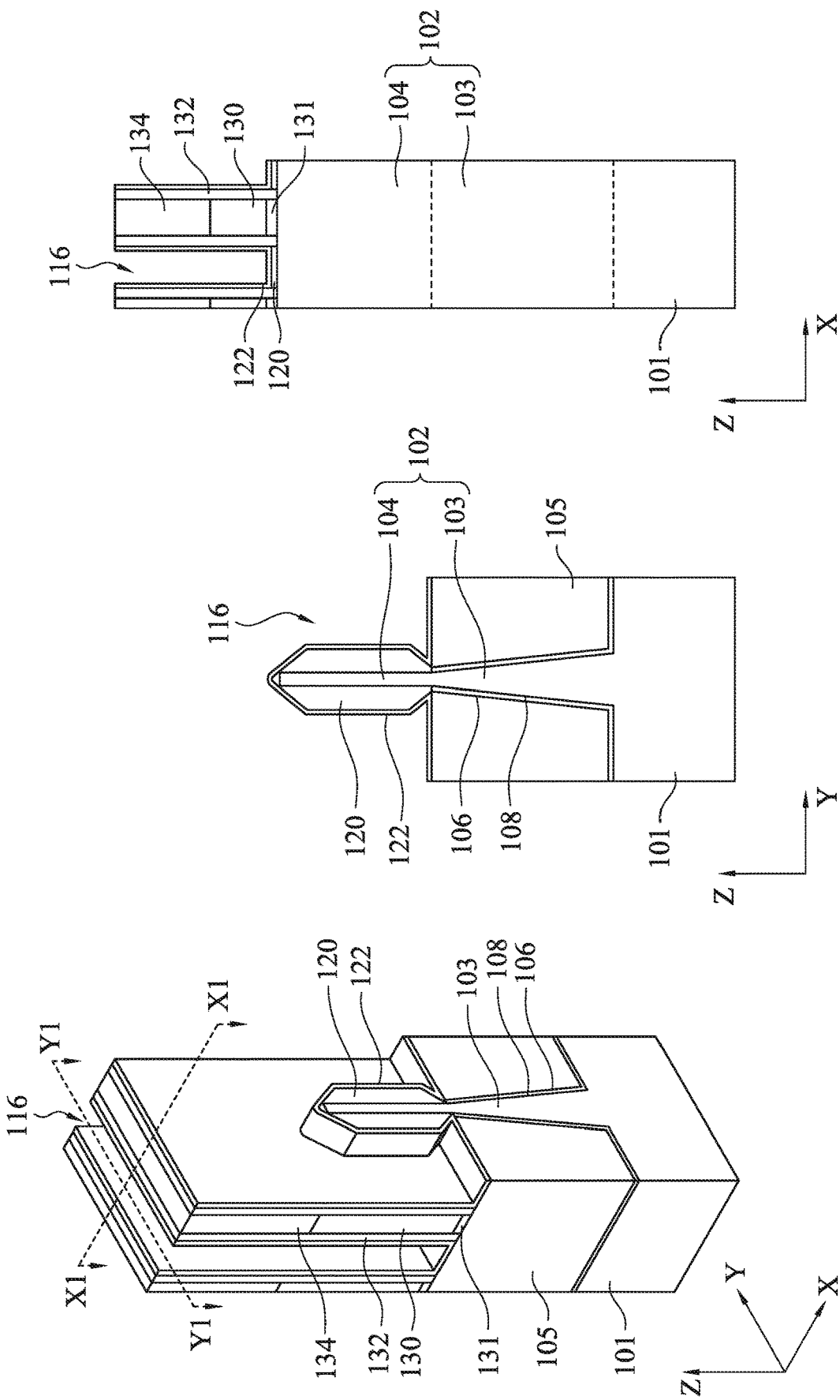
FIGS. 2A-2C illustrate one of the various stages of a semiconductor device fabrication process in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Disclosed embodiments relate to a method of forming source/drain (S/D) structures for fin field-effect transistors (FinFETs), including a method of isolating or separating the S/D structures. The embodiments such as those disclosed herein are generally applicable not only to FinFETs but also to double-gate, surround-gate, omega-gate or gate-all-around transistors, 2-dimensional FET and/or nanowire transistors, or any suitable device having a source/drain epitaxial growth process.

FIGS. 1A-9C illustrate various processes in a semiconductor device fabrication process in accordance with some embodiments of the present disclosure. Throughout the various views and illustrative embodiments, like reference numbers are used to designate like elements. In FIGS. 1A-9C, the "A" figures (e.g., FIGS. 1A, 2A, etc.) illustrate a perspective view, the "B" figures (e.g., FIGS. 1B, 2B, etc.) illustrate a cross-sectional view along the Y direction corresponding to line Y1-Y1 illustrated in the "A" figures, and the "C" figures (e.g., FIG. 1C, 2C, etc.) illustrate a cross-sectional view along the X direction corresponding to line X1-X1 illustrated in the "A" figures. It is understood that additional operations can be provided before, during, and after processes shown by FIGS. 1A-9C, and some of the operations described below can be replaced or eliminated, for additional embodiments of the method. The order of the operations/processes may be interchangeable.

Referring first to FIGS. 1A-1C, FIGS. 1A-1C illustrate the structure after various manufacturing operations to form a FinFET structure are performed. As shown in FIGS. 1A-1C, a source/drain structure 120 and a metal gate 130 together with gate dielectric layer 131 are formed over a substrate 101. This structure may be formed by the following manufacturing operations.

In FIGS. 1A-1C, there is shown a substrate 101 having one or more fin structures, with one fin structure 102 being illustrated. It is understood that one fin structure is illustrated for purposes of illustration, but other embodiments may include any number of fin structures. In some embodiments, one or more dummy fin structures are formed adjacent to the fin structure of an active FinFET. The fin structure 102 extends in the X direction and protrudes from the substrate in the Z direction, while the gate 130 extends in the Y direction.

The substrate 101 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 101 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 101 may include an epitaxial layer (epi-layer), which may be strained for performance enhancement, and/or may include a silicon-on-insulator (SOI) structure.

The fin structure 102 may be formed using, for example, a patterning process to form trenches such that the fin structure 102 is formed between adjacent fin structures. As discussed in greater detail below, the fin structure 102 will be used to form a FinFET.

Isolation regions, such as shallow trench isolations (STI) 105, are disposed in the trenches over the substrate 101. Prior to forming the isolation insulating layer 105, one or more liner layers are formed over the substrate 101 and sidewalls of the bottom part 103 of the fin structures 102 in some embodiments. In some embodiments, the liner layers includes a first fin liner layer 106 formed on the substrate 101 and sidewalls of the bottom part 103 of the fin structures 102, and a second fin liner layer 108 formed on the first fin liner layer 106. Each of the liner layers has a thickness between about 1 nm and about 20 nm in some embodiments.

In some embodiments, the first fin liner layer 106 includes silicon oxide and has a thickness between about 0.5 nm and about 5 nm, and the second fin liner layer 108 includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 105 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 105 is formed through a process such as CVD, flowable CVD (FCVD), or a spin-on-glass process, although any acceptable process may be utilized. Subsequently, portions of the isolation insulating layer 105 extending over the top surfaces of the fin structures 102, and portions of the liner layers over the top surfaces of the fin structures 102 are removed using, for example, an etch process, chemical mechanical polishing (CMP), or the like.

In some embodiments, the isolation insulating layer 105 and the liner layers are recessed to expose the upper portion 104 of the fin structure 102 as illustrated in FIGS. 1A-1C. In some embodiments, the isolation insulating layer 105 and the liner layers are recessed using a single etch processes, or multiple etch processes. In some embodiments in which the isolation insulating layer 105 is made of silicon oxide, the etch process may be, for example, a dry etch, a chemical etch, or a wet cleaning process. For example, the chemical etch may employ fluorine-containing chemical such as dilute hydrofluoric (dHF) acid. After the fin formation process, the fin height $H_{fin}$ is about 30 nm or higher, such as about 50 nm or higher, in some embodiments. In one embodiment, the fin height is between about 40 nm and about 80 nm. It is understood that the fin height may be modified by subsequent processing. Other materials, processes, and dimensions may be used.

After the fin structure 102 is formed, a dummy gate structure including a dummy gate dielectric layer and a dummy gate electrode are formed over the exposed fin structure 102. The dummy gate dielectric layer and the dummy gate electrode will be subsequently used to define and form the source/drain regions. In some embodiments, the dummy gate dielectric layer and the dummy gate electrode are formed by depositing and patterning a dummy dielectric layer formed over the exposed fin structures 102 and a dummy electrode layer over the dummy gate dielectric layer. The dummy dielectric layer may be formed by thermal oxidation, CVD, sputtering, or any other methods known and used in the art for forming a dummy dielectric layer. In some embodiments, the dummy dielectric layer may be made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

Subsequently, the dummy electrode layer is formed over the dummy dielectric layer. In some embodiments, the dummy electrode layer is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, poly-Si is used.

A mask pattern may be formed over the dummy electrode layer to aid in the patterning. The mask pattern is made of one or more layers of $SiO_2$, SiCN, SiON, $Al_2O_3$, SiN, or other suitable materials. By using the mask pattern as an etching mask, the dummy electrode layer is patterned into the dummy gate electrode. In some embodiments, the dummy dielectric layer is also patterned to define the dummy gate dielectric layer.

Subsequently, sidewall spacers 132 are formed along sidewalls of the dummy gate structure. The sidewall spacers 132 may be formed by depositing and anisotropically etching an insulating layer deposited over the dummy gate structures, the fin structure 102, and the isolation insulating layer 105. In some embodiments, the sidewall spacers 132 are formed of silicon nitride, and may have a single-layer structure. In alternative embodiments, the sidewall spacers 132 may have a composite structure including a plurality of layers. For example, the sidewall spacers 132 may include a silicon oxide layer and a silicon nitride layer over the silicon oxide layer. Other materials, such as $SiO_2$, SiCN, SiON, SiN, SiOCN, other low k material, or combinations thereof, may also be used. The thickness of the sidewall spacer 132 is in a range from about 5 nm to about 40 nm in some embodiments.

After the dummy gate structure and the sidewall spaces are formed, a source/drain (S/D) structure 120 is formed on exposed portions 104 of the fin structures 102 along opposing sides of the dummy gate structure. The S/D structure 120 may be epitaxially formed on the side faces and the top face of the exposed fin structure 104. In some embodiments, the fin structure 104 may be recessed and the S/D structure is epitaxially formed on the exposed portion of the recessed fin. The use of epitaxial grown materials in the source/drain regions allows for the source/drain regions to exert stress in a channel of a FinFET.

The materials used for the S/D structure 120 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. Other materials may be used. In some embodiments, the S/D structure 120 includes two or more epitaxial layers with different compositions and/or different dopant concentrations.

In some embodiments in which different materials are utilized for the n-type devices and the p-type devices, the one structures (e.g., the n-type fin structures) are masked while forming the epitaxial material for the other structures (e.g., the p-type fin structures), and repeating the process for the other. The S/D structure 120 may be doped either through an implanting process to implant appropriate dopants, or by in-situ doping as the material is grown. For example, for a p-channel FET where the channel may be Si or $Si_{1-x}Ge_x$, the doped epitaxial film may be boron-doped $Si_{1-y}Ge_y$, where y is equal to or larger than x to induce longitudinal compressive strain in the channel for hole mobility enhancement. For an n-channel FET where the channel may be Si, the doped epitaxial film may be, for example, phosphorus-doped silicon (Si:P) or silicon-carbon ($Si_{1-z}C_z$:P). In the case where the channel is a compound semiconductor such as $In_mGa_{1-m}As$, the doped epitaxial film may be, for example, $In_nGa_{1-n}As$, where n is smaller than or equal to m.

As shown in FIGS. 1A and 1B, the S/D structure 120 extends in the Y direction with a wider width than the fin structure 104. In some embodiments, the cross section of the S/D structure 120 in the Y direction has substantially a hexagonal shape, and in other embodiments, the cross section of the S/D structure 120 has a diamond shape, a pillar shape or a bar shape. The width $W_{SD}$ of the S/D structure in the Y direction is in a range from about 25 nm to about 100 nm in some embodiments.

After the S/D structure 120 is formed, a first insulating layer 122 as a liner layer is deposited to cover the S/D structure 120 and on the sidewalls spacers 132 of the dummy gate structure. The first insulating layer 122 acts as an etch stop during the patterning of a subsequently formed dielectric material. In some embodiments, the first insulating layer 122 includes $SiO_2$, SiCN, SiON, SiN and other suitable dielectric materials. In one embodiment, SiN is used. The first insulating layer 122 may be made of a plurality of layers that comprises combinations of the above mentioned materials. The first insulating layer 122 may be deposited through one or more processes such as PVD, CVD, or ALD, although any acceptable process may be utilized. Other materials and/or processes may be used. In some embodiments, the first insulating layer 122 has a thickness between about 0.5 nm and about 5 nm. Other thicknesses may be used in other embodiments.

After the first insulating layer 122 is formed, a first sacrificial layer 115 is formed over the first insulating layer 122. In some embodiments, the first sacrificial layer includes one or more layers of dielectric material, such as $SiO_2$, SiCN, SiON, SiOC, SiOH, SiN, or other suitable dielectric materials. In some embodiments, the first sacrificial layer 115 is formed through a film forming process, such as, CVD, PVD, ALD, FCVD, or a spin-on-glass process, although any acceptable process may be utilized. Subsequently, portions of the first insulating layer 122 are removed using, for example, an etch process, CMP, or the like, to exposed the upper surface of the dummy gate electrode.

Subsequently, the dummy gate electrode and the dummy gate dielectric layer are removed. The removal process may include one or more etch processes. For example in some embodiments, the removal process includes selectively etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$:$H_2O_2$:$H_2O$ (APM), $NH_2OH$, KOH, $HNO_3$:$NH_4F$:$H_2O$, and/or the like. The dummy gate dielectric layer may be removed using a wet etch process, such as a diluted HF acid, may be used. Other processes and materials may be used.

After the dummy gate structure is removed, a gate dielectric layer 131 is formed over a channel region of the fin structure 104. In some embodiments, the gate dielectric layer 131 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 131 include molecular-beam deposition (MBD), ALD, PVD, and the like. In some embodiments, the gate dielectric layer 131 has a thickness of about 0.5 nm to about 5 nm. In some embodiments, the gate dielectric layer 131 is formed also on sides of the sidewall spacers 132.

In some embodiments, an interfacial layer (not shown) may be formed over the channel region 104 prior to forming the gate dielectric layer 131, and the gate dielectric layer 131 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer has a thickness of about 0.2 nm to about 1 nm.

After the gate dielectric layer 131 is formed, a gate electrode 130 is formed over the gate dielectric layer 131. The gate electrode 130 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode 130 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 130 has a thickness in the range of about 5 nm to about 100 nm. The gate electrode 130 may be formed using a suitable process such as ALD, CVD, PVD, plating, or combinations thereof. A planarization process, such as a CMP, may be performed to remove excess materials.

In certain embodiments of the present disclosure, the gate electrode 130 includes one or more work function adjustment layers (not shown) disposed on the gate dielectric layer 131. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

Then, the gate electrode 130, the gate dielectric layer 131 and the work function adjustment layer are recessed, and a gate cap layer 134 is formed on the recessed gate electrode 130. In some embodiments, when the gate electrode 130 is mainly made of W, the gate electrode may be recessed using, for example, dry etch process using $Cl_2/O_2/BCl_3$, at a temperature range of 24° C. to 150° C., and at a pressure of below 1 Torr.

After recessing the gate electrode 130, the gate cap layer 134 is formed in the recess to protect the gate electrode 130 during subsequent processes. In some embodiments, the gate cap layer 134 includes $SiO_2$, SiCN, SiON, SiN, $Al_2O_3$, $La_2O_3$, SiN, a combination thereof, or the like, but other suitable dielectric films may be used. The gate cap layer 134 may be formed using, for example, CVD, PVD, spin-on, or the like. Other suitable process steps may be used. A planarization process, such as a CMP, may be performed to remove excess materials.

FIGS. 2A-2C show exemplary views of one of the various stages for manufacturing a FinFET device according to some embodiments of the present disclosure.

As shown in FIGS. 2A-2C, the first sacrificial layer 115 is at least partially removed from both side regions of the S/D structure 120, to form openings 116. In some embodiments, all of the first sacrificial layer 115 are removed. The first sacrificial layer 115 may be removed by suitable etching operations, such as dry etching and/or wet etching. The etching operation substantially stops at the first insulating layer 122. In some embodiments, the first insulating layer 122 has a thickness between about 0.5 nm and about 10 nm.

FIGS. 3A-3C show exemplary views of one of the various stages for manufacturing a FinFET device according to some embodiments of the present disclosure.

After the openings 116 are formed, a second sacrificial layer 140 is formed in the openings 116. The second sacrificial layer 140 is made of a material having a higher (e.g., 5 or more) etching selectivity with respect to the materials of the first insulating layer 122 and/or the isolation insulating layer 105. In some embodiments, the second sacrificial layer 140 is made of one or more layers of Group IV materials, such as Si, SiGe, SiC, Ge, SiGeC and GeSn, which may be crystalline, polycrystalline or amorphous and may be doped or un-doped. In other embodiments, the second sacrificial layer 140 is made of one or more silicon based dielectric layers of SiOC, SiC, SiON, SiCN, SiOCN, SiN and/or $SiO_2$. Aluminum based dielectric materials, such as aluminum oxide, aluminum oxy-carbide and aluminum oxy-nitride may be used. A SOC (spin-on-carbon) may also be used. In certain embodiments, the second sacrificial layer 140 is made of one or more layers of a Group III-V compound semiconductor including, but not limited to, GaAs, GaN, InGaAs, InAs, InP, InSb, InAsSb, AlN and/or AlGaN. The second sacrificial layer 140 may be deposited through one or more processes such as PVD, CVD, or ALD, although any acceptable process may be utilized. Other materials and/or processes may be used. In one embodiment, Si is used as the second sacrificial layer.

A planarization operation, such as, an etch-back process or CMP, may be performed to planarize the upper surface of the second sacrificial layer 140. By the planarization operation, the upper surface of the gate cap layer 134 is exposed. After the planarization operation, the height $H_{sacr}$ of the second sacrificial layer measured from the surface of the first insulating layer 122 on the isolation insulating layer 105 is in a range from about 100 nm to about 350 nm in some embodiments.

Figures 4A, 4B, 4C:
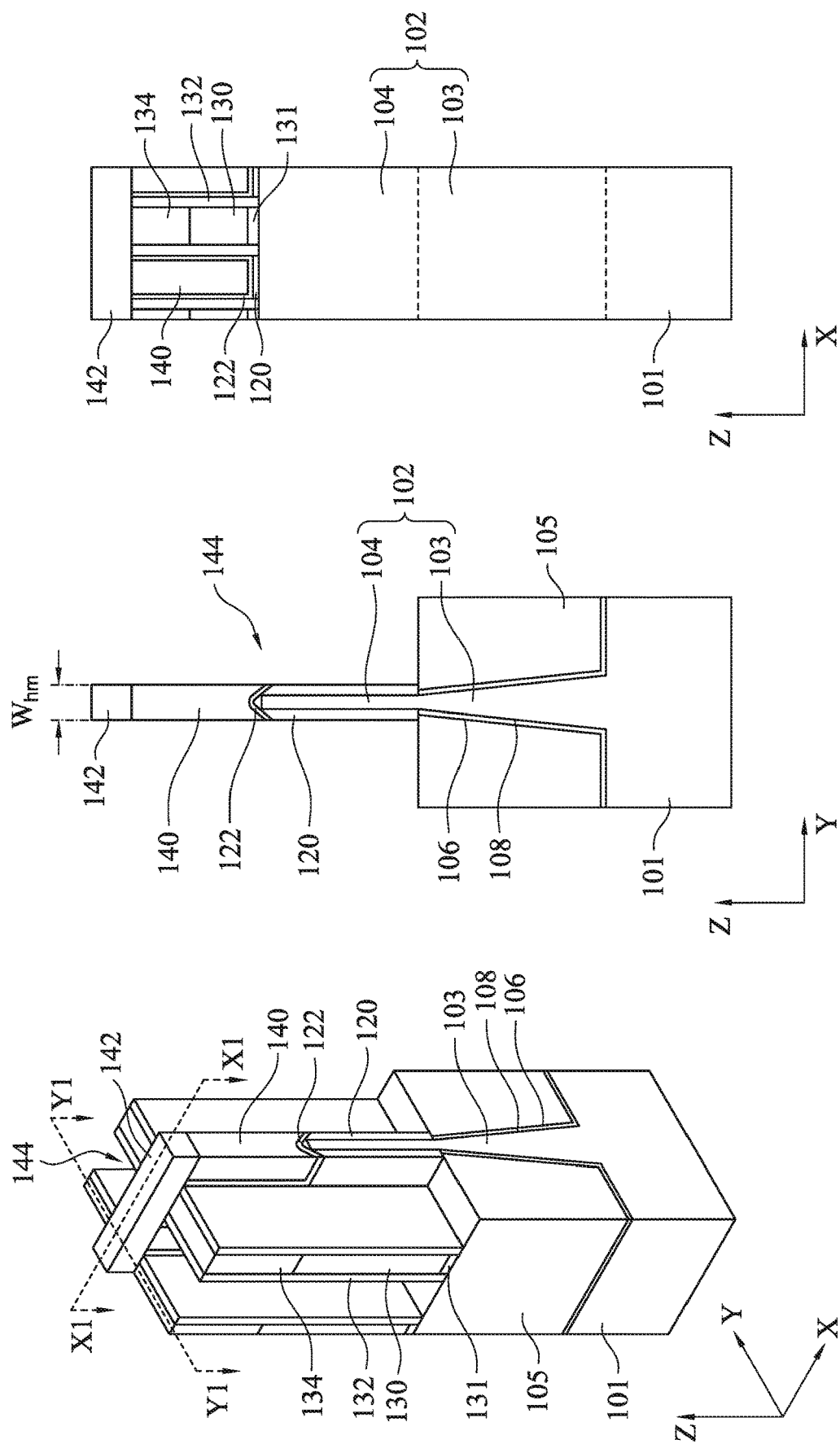
FIGS. 4A-4C illustrate one of the various stages of a semiconductor device fabrication process in accordance with some embodiments of the present disclosure.

FIGS. 4A-4C show exemplary views of one of the various stages for manufacturing a FinFET device according to some embodiments of the present disclosure.

After the second sacrificial layer 140 is formed, a mask pattern 142 is formed over the second sacrificial layer 140. The mask pattern 142 may be formed by patterning a layer of suitable mask material using a photo-etching operation. The mask pattern 142 extends in the X direction, and has a width $W_{hm}$ in the Y direction in a range from about 5 nm to about 100 nm in some embodiments, and in a range from about 10 nm to about 40 nm in other embodiments. The width $W_{hm}$ may be other values depending on design rules and/or types of semiconductor devices.

The mask pattern 142 is made of one or more layers of dielectric material, such as $SiO_2$, SiN and/or SiON, and/or TiN. The material for the mask pattern 142 may be deposited through one or more processes such as PVD, CVD, or ALD, although any acceptable process may be utilized. Other materials and/or processes may be used.

By using the mask pattern 142 as an etching mask, the second sacrificial layer 140, the first insulating layer 122 and the S/D structure 120 are anisotropically etched, thereby forming openings 144 adjacent to the patterned second sacrificial layer 140 and S/D structure 120. The etching operation may include multiple etching processes using different plasma gases.

When a Si based material (e.g., poly-Si or amorphous Si) is used as the second sacrificial layer 140, the etching can be performed by plasma dry etching using, for example, a gas including HBr or a gas including $Cl_2$ and $SF_6$. When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer 140, the etching can be performed by plasma dry etching using, for example, a gas including a fluorocarbon and/or fluorine. When a Ge based material (e.g., Ge or SiGe) is used as the second sacrificial layer 140, the etching can be performed by plasma dry etching using, for example, a gas including a fluorocarbon or a gas including a halogen. During the etching, the substrate may be heated at a temperature between about 20° C. to about 200° C.

By this etching operation, at least the side portions of the S/D structure 120 are removed, such that the etched side surfaces of the S/D structure 120 are substantially parallel to the side surfaces of the upper fin structure 104. An etching amount of one side portion of the S/D structure 120 (substantially equal to half of the difference between $W_{SD}$ shown in FIG. 1B and $W_{hm}$ shown in FIG. 3B) is in a range from about 5 nm to about 40 nm in some embodiments. After the patterning (etching) of the S/D structure 120, the width of the patterned S/D structure 120 in the Y direction is in a range from about 10 nm to about 40 nm in some embodiments, when both side portions are etched.

In FIGS. 4A and 4B, both side portions of the S/D structure 120 are etched and in other embodiments, only one side portion of the S/D structure 120 is etched by using a mask pattern 142 having a different shape.

It is noted that as shown in FIG. 4A, the gate cap layer 134 is not substantially etched during the patterning of the second sacrificial layer 140 and source/drain structure 120. In other words, the material for the mask pattern 142 has a high etching selectivity (e.g., 5 or more) with respect to the gate cap layer 134.

Figure 5A:
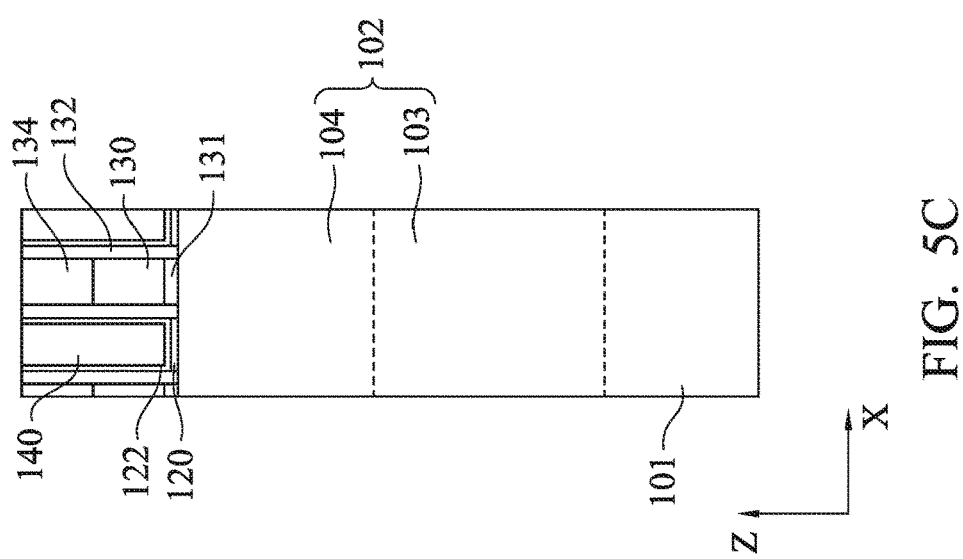
FIGS. 5A-5C illustrate one of the various stages of a semiconductor device fabrication process in accordance with some embodiments of the present disclosure.
Figure 5B:
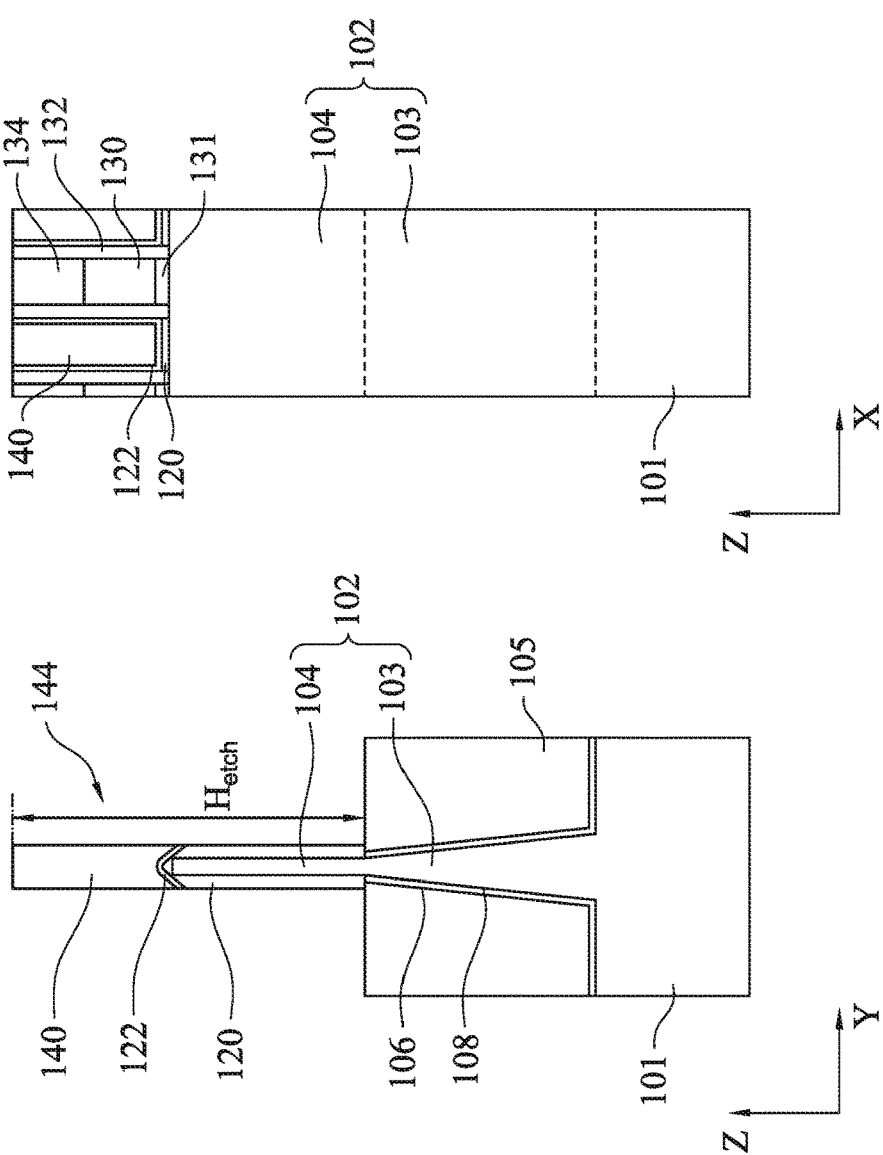
Figure 5C:
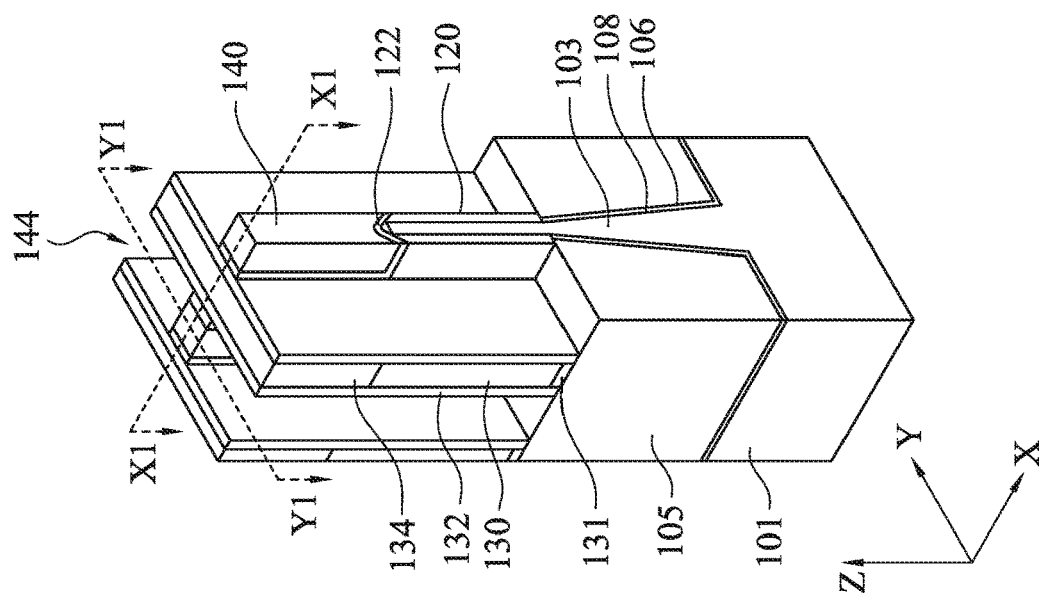

FIGS. 5A-5C show exemplary views of one of the various stages for manufacturing a FinFET device according to some embodiments of the present disclosure.

The mask pattern 142 is removed by using a suitable etching operation and/or a planarization operation, such as CMP. After the mask pattern 142 is removed, the height $H_{etch}$ of the second sacrificial layer 140 from the surface of the isolation insulating layer 105 is in a range from about 80 nm to about 250 nm in some embodiments.

FIGS. 6A-6C show exemplary views of one of the various stages for manufacturing a FinFET device according to some embodiments of the present disclosure.

After the mask pattern 142 is removed, a second insulating layer 146 is formed over the patterned second sacrificial layer 140 and the patterned S/D structure 120. As shown in FIG. 6A, the second insulating layer 146 is formed also on the sidewall spacers 132 and the gate cap layer 134.

In some embodiments, the second insulating layer 146 includes $SiO_2$, SiCN, SiON, SiCN, SiOCN and SiN, but other suitable dielectric materials may be used. In one embodiment, a silicon nitride based material, such as SiN, is used. The second insulating layer 146 may be made of a plurality of layers that comprises combinations of the above mentioned materials. The second insulating layer 146 may be deposited through one or more processes such as PVD, CVD, or ALD, although any acceptable process may be utilized. Other materials and/or processes may be used. In some embodiments, the second insulating layer 146 has a thickness between about 1 nm and about 10 nm. Other thicknesses are used in other embodiments.

In some embodiments, a silicide layer 126 is formed on the patterned S/D structure 120 before forming the second insulating layer 146 to reduce $R_c$ between the S/D structure and a contact metal formed thereafter, as shown in FIGS. 6A and 6B. The metal silicide formation process may form a metal silicide on the side portions of the S/D structure. The metal silicide formation process includes a metal film deposition on the S/D structure 120, a thermal treatment to form a metal silicide at the interface or surface of the S/D structure 120, and an etching process to remove the excess unreacted metal. The metal silicide comprises $TiSi_x$, $NiSi_x$, $CoSi_x$, $NiCoSi_x$, and $TaSi_x$, but other suitable silicide materials may be used. In some embodiments, the silicide layer 126 has a thickness between about 0.5 nm and about 10 nm. In other embodiments, a silicide layer is not formed at this stage of the manufacturing operations, and may be formed at a later manufacturing stage.

Figures 7A, 7B, 7C:
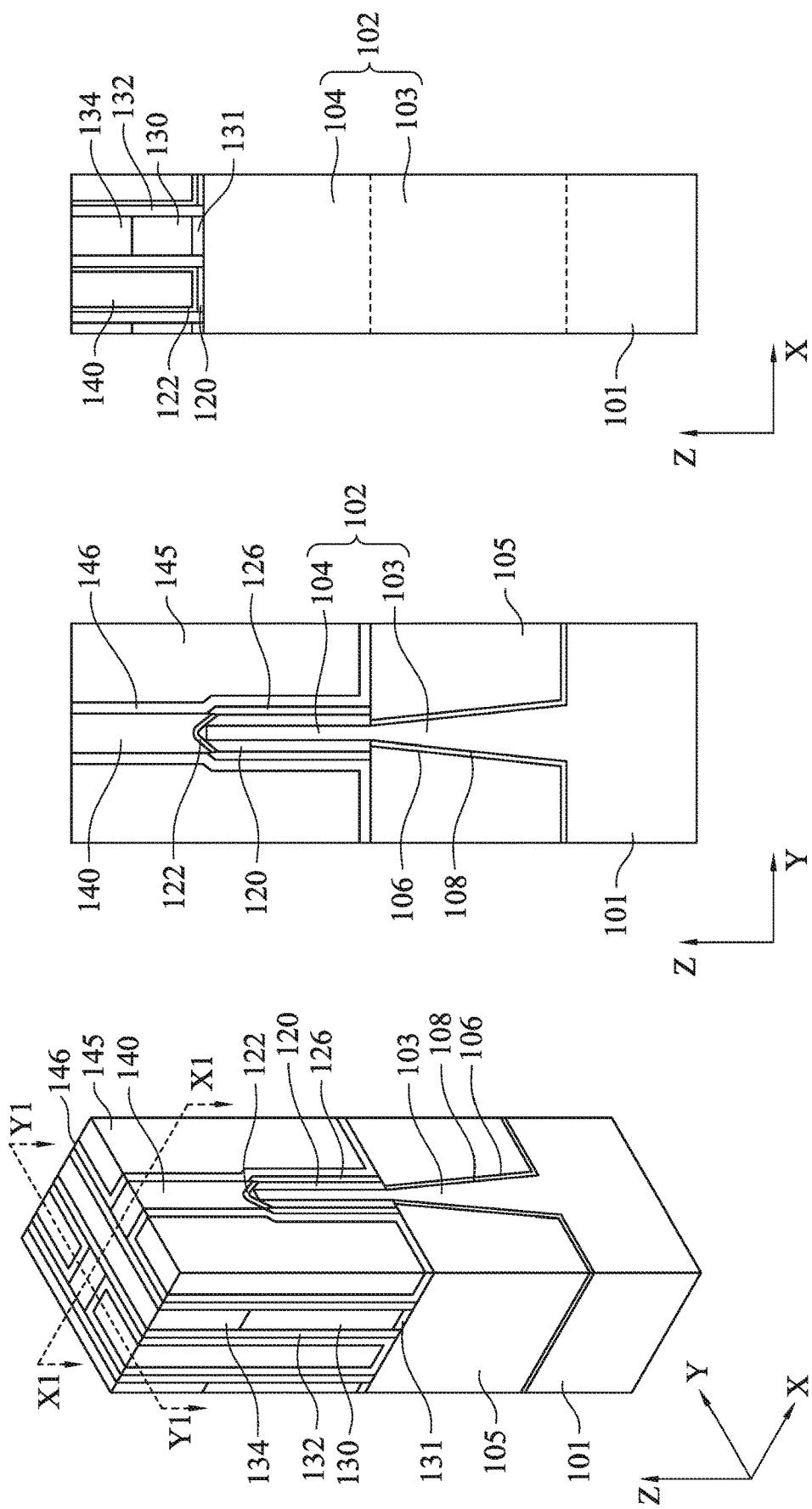
FIGS. 7A-7C illustrate one of the various stages of a semiconductor device fabrication process in accordance with some embodiments of the present disclosure.

FIGS. 7A-7C show exemplary views of one of the various stages for manufacturing a FinFET device according to some embodiments of the present disclosure.

After the second insulating layer 146 is formed, a first interlayer dielectric (ILD) layer 145 is formed to fill the openings 144 and over the second sacrificial layer 140 and the S/D structure 120.

The ILD layer 145 may include a single layer or multiple layers. In some embodiments, the ILD layer 145 includes $SiO_2$, SiCN, SiOC, SiON, SiOCN, SiN or a low-k material, but other suitable dielectric film may be used. The ILD layer 145 maybe formed by CVD, PECVD or ALD, FCVD, or a spin-on-glass process. A planarization process, such as a CMP process, may be performed to remove excess materials. By the planarization process, the upper surface of the second sacrificial layer 140 (and the cap insulation layer 134) is exposed in some embodiments.

When a FCVD is used, a curing process is performed on the flowable isolation dielectric precursor in some embodiments. The curing process may include UV curing, ozone ($O_3$) plasma curing or low-temperature $O_3$ plasma+UV curing (LTB+UV curing), so as to transfer the flowable isolation dielectric precursor into the dielectric layer such as silicon oxide layer. A processing temperature range of the UV curing process is between about 0° C. and about 10° C., in some embodiments. A processing temperature range of the $O_3$ plasma curing process is between about 100° C. and about 250° C. in some embodiments. A processing temperature range of the LTB+UV curing process is between about 30° C. and about 50° C., in some embodiments. The curing process may be performed only one time after the deposition process for saving process time, but not limited thereto, in some embodiments. The deposition process and the curing process can be alternately performed. In other embodiments, the flowable isolation dielectric precursor can also be directly transferred into the dielectric layer through an oxidation process by directly introducing nitrogen, oxygen, ozone or steam.

In order to further increase the structural density of the ILD layer, after the curing process, a thermal treatment process may be performed on the isolation dielectric layer. The thermal treatment process includes a steam containing thermal treatment process (wet annealing) and a nitrogen-containing thermal treatment process (dry annealing). A processing temperature range of the steam-containing thermal treatment is between about 400° C. and about 1000° C., in some embodiments, and the processing temperature of the nitrogen-containing thermal treatment process is between about 1000° C. and about 1200° C. In other embodiments, the temperature of thermal treatment can be reduced to about 400° C. by exposing the film to ultra-violet radiation, e.g., in a ultra violet thermal processing (UVTP) process.

After the curing or treatment, the ILD layer may have a relative permittivity of less than 6, in some embodiments.

In other embodiments, a spin on dielectric (SOD) process is performed to form the IID layer 145. In this embodiment, the second insulating layer 146, a nitride-containing liner layer, is formed in the prior process to provide a suitable inter layer to the deposited isolation dielectric layer in contact isolation region by SOD process. Therefore, the ILD layer may be formed by SOD process using suitable precursor.

In the SOD process for the ILD layer 145, the precursor may be organosilicon compounds, such as but not limited to siloxane, methylsiloxane, polysilazane and hydrogensilsesquioxane, perhydropolysilazane (PHPS), and other suitable material. The SOD precursor is dissolved in a compatible organic solvent commonly used in coating solutions of spin-on chemicals. Suitable organic solvents include, for example, dibutyl ether (DBE), toluene, xylene, propyleenglycolmonomethyletheracetaat (PGMEA), ethyl lactate and isopropyl alcohol (IPA), and the like, preferably use xylene as the solvent for PHPS. The concentration of the SOD precursor in solution can be varied to adjust the consistency (i.e., viscosity) of the solution and thickness of the coating. A solution containing between about 4% to about 30% by weight of SOD precursor can be used, in some embodiments. In other embodiments, a solution containing about 8% to about 20% by weight SOD precursor is used. Additional minor amounts of additives such as surfactants and binders can be included in the solution.

The wafer is spun to uniformly spread SOD precursor from wafer center to edge during precursor spin-on process. The spin speed of cast rotation for SOD precursor coating on substrate is probably from 100 rpm to 3000 rpm, in some embodiments, for a 12 inch wafer. The dynamic dispense rate of SOD precursor is around 1 ml/sec in some embodiments, and the dispense puddle will spread completely to the edge of the wafer before main speed. The SOD precursor can therefore totally cover the bottom of contact isolation hole and fill the opening 144.

Subsequently, a prebaking process is performed after SOD deposition to stable the SOD layer. The prebaking process is performed at low temperature in a range of about 100° C. to about 200° C. with air ambient, in some embodiments. A thermal treatment process is performed after pre-baking process to densify the SOD layer. The thermal treatment process is an annealing process performed at high temperature in a range of about 400° C. to about 1100° C., in some embodiments. The annealing process may be wet annealing process using a gas included steam, $O_2$ and $H_2$ gas or a dry annealing process using a gas included $N_2$ and $O_2$ gas. In the other embodiment, the thermal treatment process uses plasma at a lower temperature in a range of about 150° C. to about 400° C. The partial pressure ratio of water vapor ($H_2O$) to hydrogen ($H_2$) preferably is controlled to a value in a range of about $1\times10^{-11}$ to about 1.55.

FIGS. 8A-8C show exemplary views of one of the various stages for manufacturing a FinFET device according to some embodiments of the present disclosure.

Subsequently, the second sacrificial layer 140 is removed, followed by removal of the first insulating layer 122 remaining on the top of the S/D structure 120, thereby forming a contact opening 148. As shown in FIGS. 8A-8C, the contact opening 148 is defined by the second insulating layer 146 and the sidewall spacers 132. The etching operation to remove the second sacrificial layer 140 may be isotropic or anisotropic.

When a Si based material (e.g., poly-Si or amorphous Si) is used as the second sacrificial layer 140, the etching can be performed by plasma dry etching using a gas including $Cl_2$ and $NF_3$ or a gas including $F_2$, or wet etching using $NH_4OH$ and/or tetramethylammonium (TMAH). When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer 140, the etching can be performed by wet etching using, for example, HF or BHF.

When a Ge based material (e.g., Ge or SiGe) is used as the second sacrificial layer 140, the etching can be performed by plasma dry etching using, for example, ozone or wet etching using a solution containing $NH_4OH$ and $H_2O_2$ or a solution containing HCl and $H_2O_2$. The remaining first insulating layer 122 can be removed by using a suitable etching operation.

FIGS. 9A-9C show exemplary views of one of the various stages for manufacturing a FinFET device according to some embodiments of the present disclosure.

After the second sacrificial layer 140 and the remaining first insulating layer 122 are removed, an additional silicide layer 127 is formed on the exposed top of the S/D structure 120. When the silicide layer 126 is not formed, a silicide layer is disposed only on the top portion (at the bottom of the contact opening 148 defined by the second insulating layer 146 and the sidewall spacers 132) of the S/D structure 120. The silicide layer 127 can be formed by a similar metal silicide formation process to the formation of the silicide layer 126. In some embodiments, the silicide layer 127 has a thickness between about 0.5 nm and about 10 nm.

Subsequently, a contact 150 is formed in the contact opening 148 to contact the silicide layer 127 formed on the top of the S/D structure 120.

The contact 150 may include a single layer or a multi-layer structure. For example, in some embodiments, the contact 150 includes a contact liner layer, such as a diffusion barrier layer, an adhesion layer, or the like, and a contact body formed over the contact liner layer in the contact opening 148. The contact liner layer may include Ti, TiN, Ta, TaN, or the like formed by ALD, CVD, or the like. The contact body may be formed by depositing a conductive material, such as one or more layers of Ni, Ta, TaN, W, Co, Ti, TiN, Al, Cu, Au, alloys thereof, combinations thereof, or the like, but other suitable metals may also be used. A planarization process, such as a CMP, may be performed to remove excess material from a surface of the ILD layer 145.

After the contact 150 is formed, the height $H_g$ of the gate structure including the gate cap layer 134 measured from the top of the fin structure 104 is in a range from about 20 nm to 100 nm and the height $H_{mg}$ of the metal gate 130 measured from the top of the fin structure 104 is in a range from about 10 nm to about 60 nm in some embodiments.

After forming the contact 150, further CMOS processes are performed to form various features such as additional interlayer dielectric layers, contacts/vias, interconnect metal layers, and passivation layers, etc.

FIGS. 10A-21D illustrate various processes in a semiconductor device fabrication process in accordance with other embodiments of the present disclosure. It is understood that additional operations can be provided before, during, and after processes shown by FIGS. 10A-21D, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-9C may be employed in the following embodiments, and detailed explanation thereof may be omitted.

FIGS. 10A-21D illustrate various processes in a semiconductor device fabrication process of static random access memory (SRAM) cells formed by FinFETs. As shown in FIGS. 10A-10E, source/drain structures 220 and 221, and metal gates 230 together with gate dielectric layers 231 are formed over a substrate 201. This structure may be formed by the manufacturing operations as set forth above.

Figures 10A, 10B:
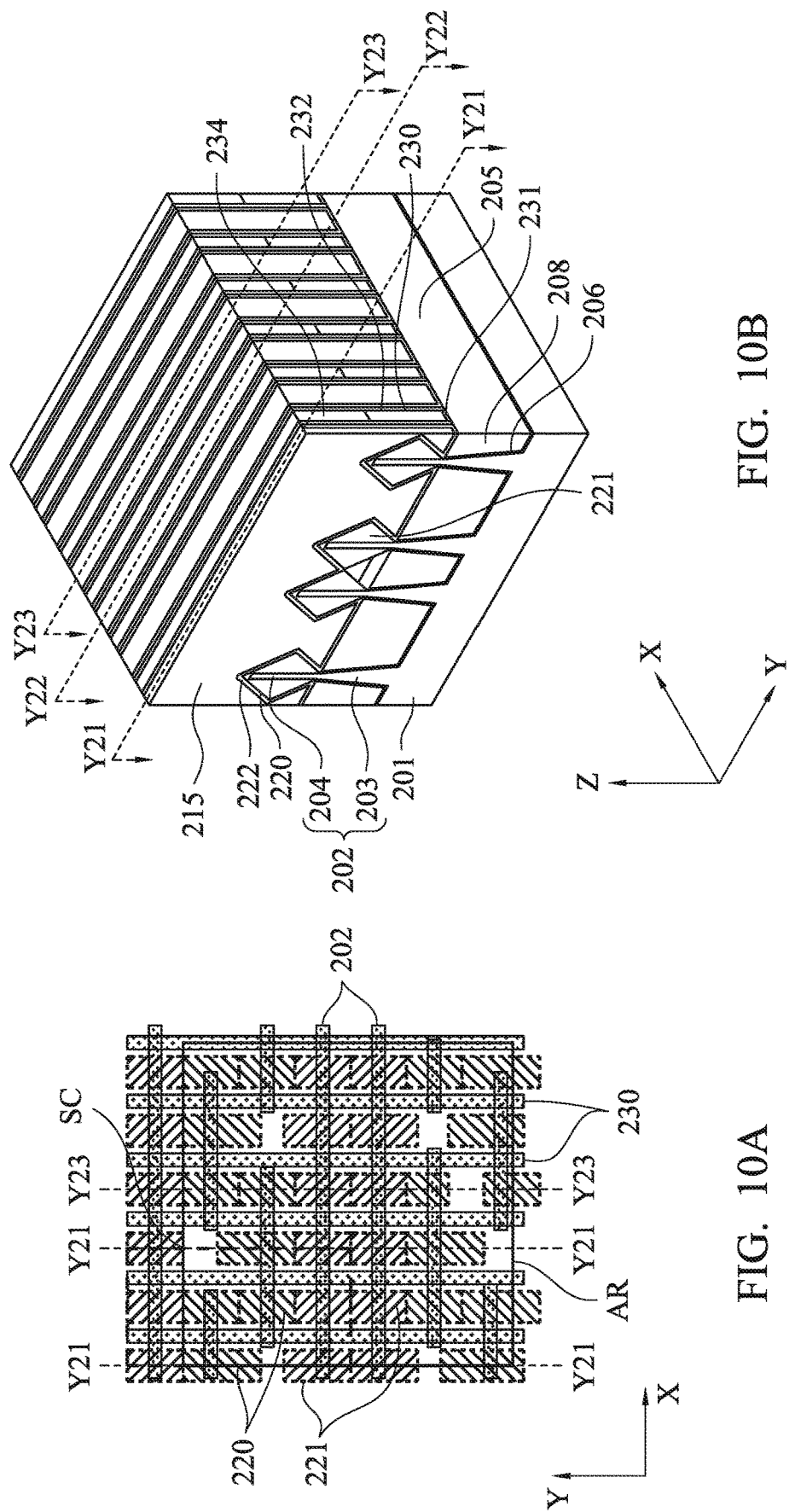
FIGS. 10A-10E illustrate one of the various stages of a semiconductor device fabrication process in accordance with one or more embodiments of the present disclosure.

FIG. 10A illustrates a plan view of SRAM cells. FIG. 10B is a perspective view corresponding to area AR of FIG. 10A. A cell boundary of one SRAM unit cell is illustrated by SC. Within one SRAM unit cell, there are two gates 230 and four fin structures 202. S/D structures 220 of a first conductivity type and S/D structures of a second conductivity type 221 are formed over the fin structures between the gates. In one embodiment, the first conductivity type is a p-type and the second conductivity type is an n-type. In another embodiment, the first conductivity type is an n-type and the second conductivity type is a p-type.

Similar to FIGS. 1A-1C, fin structures 202 including bottom portions 203 and upper portions 204 are disposed over a substrate 201. The bottom portions 203 are embedded in an isolation insulating layer 205 and the upper portions 204 protrude from the isolation insulating layer 205. Gate cap layers 234 are formed on the gates 230, respectively, and the gate cap layer 234 and the gates 230 are disposed between sidewall spacers 232. A first insulating layer 222 covers the S/D structures and a first sacrificial layer 215 is formed over the S/D structures covered by the first insulating layer 222 between the gate structures.

Figure 10C:
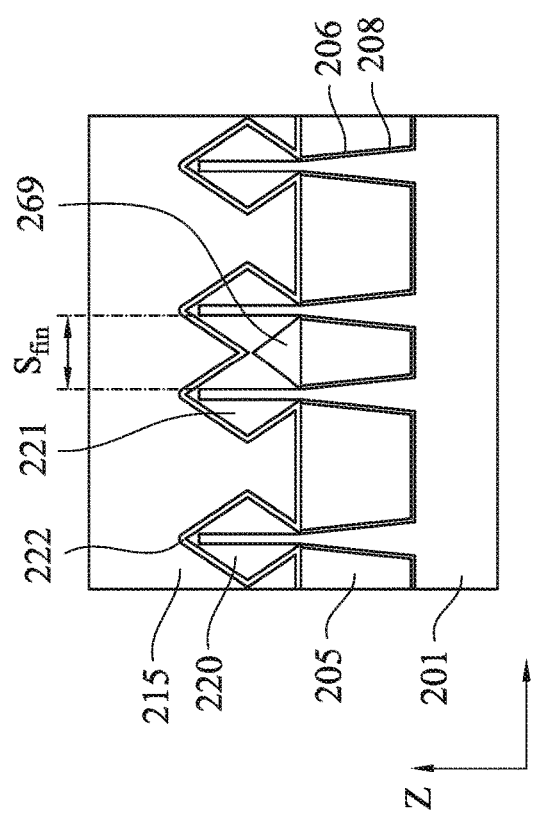
Figure 10E:
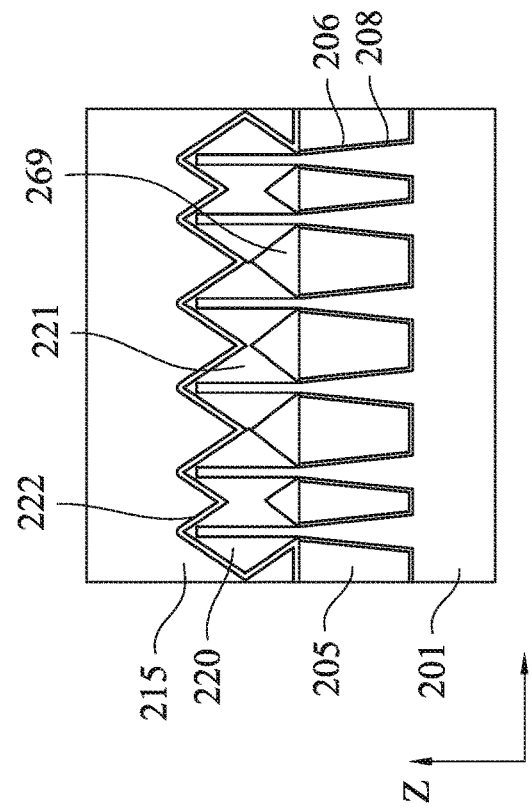
Figure 10D:
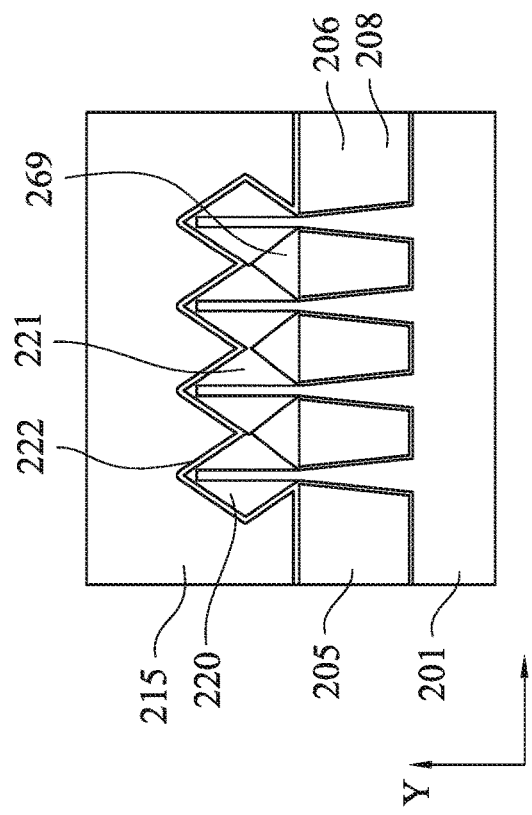

FIGS. 10C-10E are cross sectional views corresponding to lines Y21-Y21, Y22-Y22 and Y23-Y23 of FIG. 10A, respectively. At this stage of the manufacturing operations, some of the S/D structures are undesirably merged with one or two adjacent S/D structures due to a narrow separation between adjacent fin structures. For example, when the space $S_{fin}$ between two adjacent fin structures is less than about 100 nm, epitaxially formed layers of adjacent S/D structures tend to be merged.

In the cross section corresponding to line Y21-Y21 shown in FIG. 10C, adjacent second conductivity type S/D structures 221, more specifically, epitaxially formed layers, are merged. In the cross section corresponding to line Y22-Y22 shown in FIG. 10D, adjacent second conductivity type S/D structures 221, more specifically, epitaxially formed layers, are merged, and adjacent first conductivity type S/D structures 220 and the second conductivity type S/D structures are merged, respectively. In the cross section corresponding to line Y23-Y23 shown in FIG. 10E, adjacent second conductivity type S/D structures 221 are merged, adjacent first conductivity type S/D structures 220 are merged, and adjacent first conductivity S/D structure and the second conductivity type S/D structures are merged, respectively. Some of the merged S/D structures will be separated by the following operations. In some embodiments, voids 269 are formed under the merged portions of the S/D structures. In other embodiments, one S/D structure is not merged with, but is located very close to the adjacent S/D structure (e.g., less than about 3 nm), which may cause a current leakage by electric breakdown. The embodiments of the present disclosure are applicable to such closely located S/D structures.

Figures 11A, 11B:
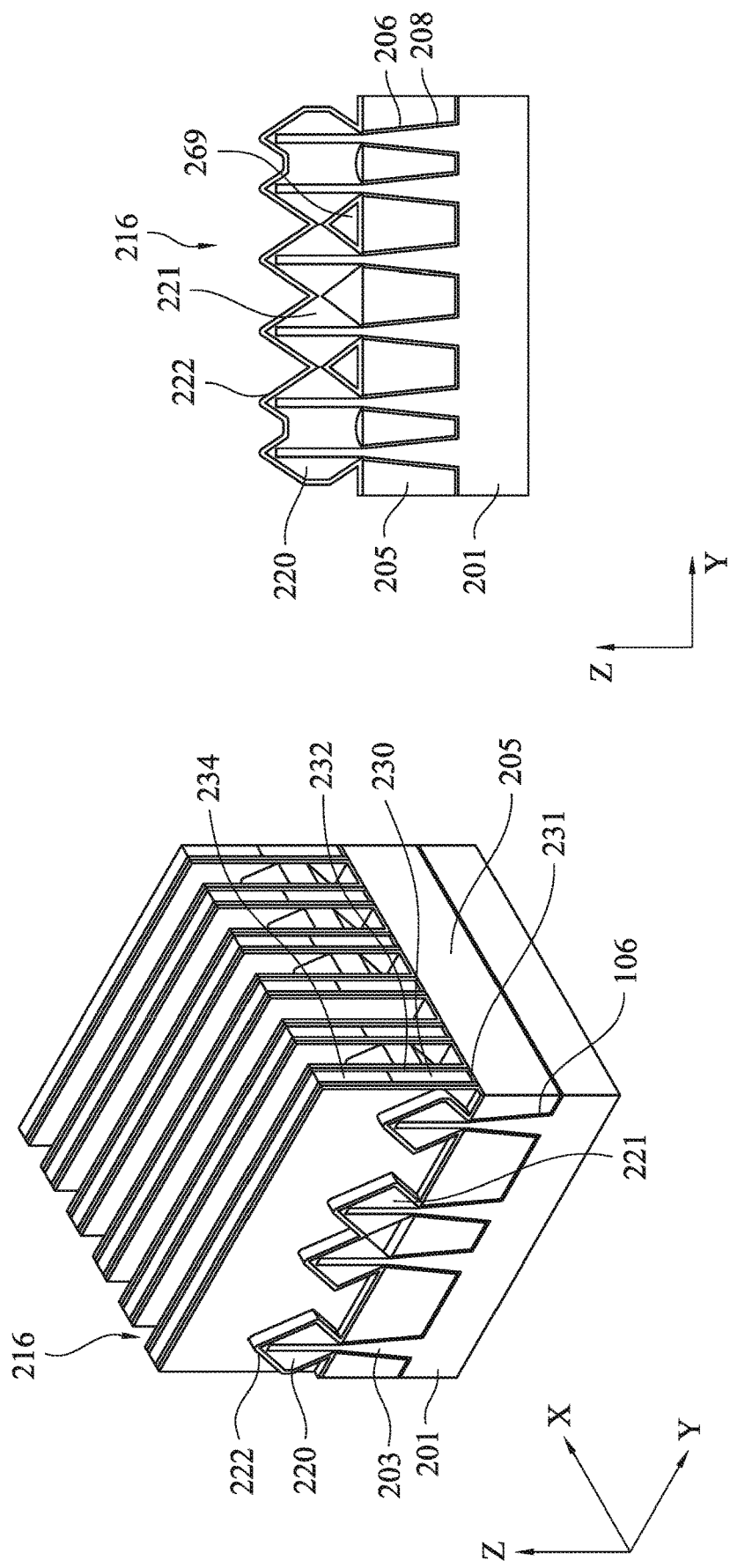
FIGS. 11A and 11B illustrate one of the various stages of a semiconductor device fabrication process in accordance with one or more embodiments of the present disclosure.

FIGS. 11A and 11B show exemplary views of one of the various stages for manufacturing a FinFET device according to some embodiments of the present disclosure. FIG. 11A is a perspective view and FIG. 11B is a cross sectional view corresponding to line Y23-Y23 of FIGS. 10A and 10B.

Similar to FIGS. 2A-2C, the first sacrificial layer 215 is at least partially removed from both side regions of the S/D structures 220 and 221 to form openings 216 and to expose the first insulating layer 222. In some embodiments, all of the first sacrificial layer 215 is removed.

Figures 12A, 12B:
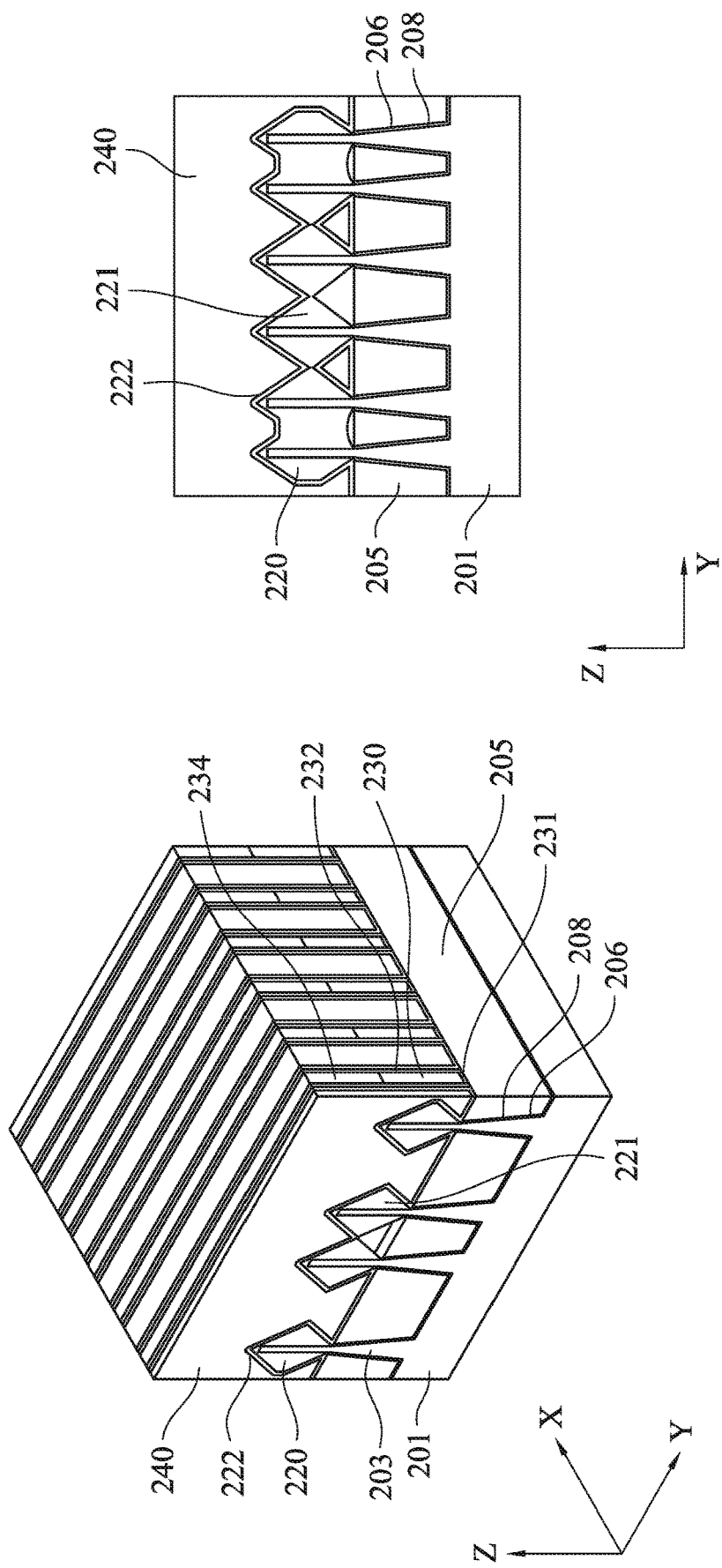
FIGS. 12A and 12B illustrate one of the various stages of a semiconductor device fabrication process in accordance with one or more embodiments of the present disclosure.

FIGS. 12A and 12B show exemplary views of one of the various stages for manufacturing a FinFET device according to some embodiments of the present disclosure. FIG. 12A is a perspective view and FIG. 12B is a cross sectional view corresponding to line Y23-Y23 of FIGS. 10A and 10B.

Similar to FIGS. 3A-3C, after the openings 216 are formed, second sacrificial layers 240 are formed in the openings 216.

Figure 13:
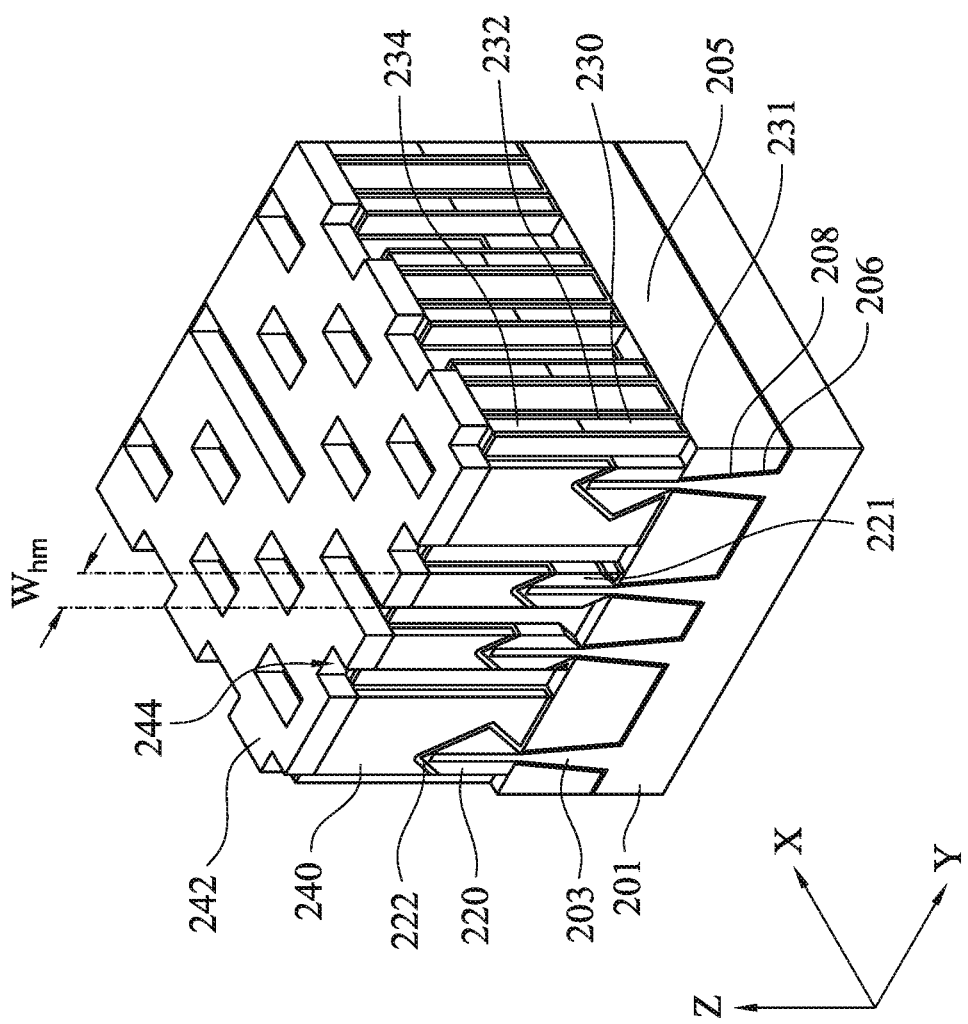
FIG. 13 illustrates one of the various stages of a semiconductor device fabrication process in accordance with one or more embodiments of the present disclosure.

FIG. 13 shows an exemplary view of one of the various stages for manufacturing a FinFET device according to some embodiments of the present disclosure.

Similar to FIGS. 4A-4C, after the second sacrificial layers 240 are formed, a mask pattern 242 is formed over the second sacrificial layers 240 and the gate structures. A portion of the mask pattern 142 above the S/D structure has a width $W_{hm}$ in a range from about 10 nm to about 40 nm in some embodiments.

By using the mask pattern 242 as an etching mask, the second sacrificial layers 240, the first insulating layer 222 and the S/D structures 220 and 221 are anisotropically etched, thereby forming openings 244 adjacent to the patterned second sacrificial layers 240 and S/D structures 220 and 221.

By this etching operation, at least one of the side portions of the S/D structures 220 and 221 are removed, such that the etched side surfaces of the S/D structures 220 and 221 are substantially parallel to the side surfaces of the upper fin structures 204.

Figure 14:
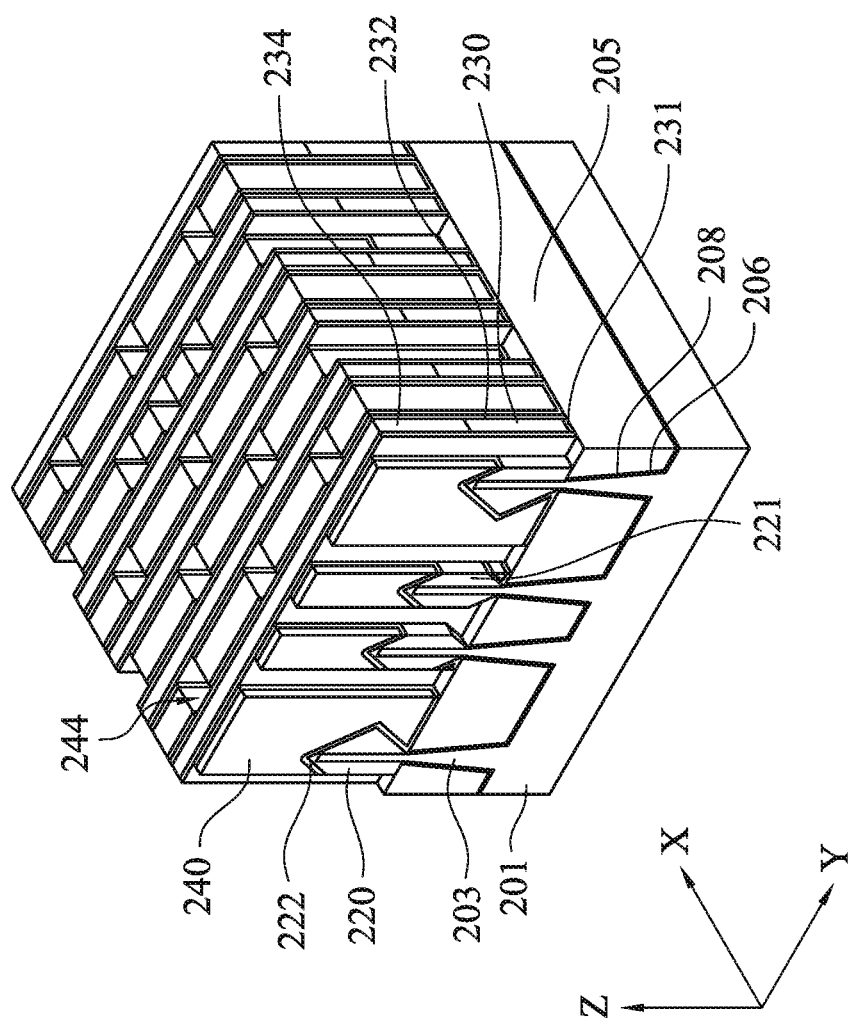
FIG. 14 illustrates one of the various stages of a semiconductor device fabrication process in accordance with one or more embodiments of the present disclosure.

FIG. 14 shows an exemplary view of one of the various stages for manufacturing a FinFET device according to some embodiments of the present disclosure.

Similar to FIGS. 5A-5C, the mask pattern 242 is removed by using a suitable etching operation and/or a planarization operation, such as CMP.

Figures 15A, 15B:
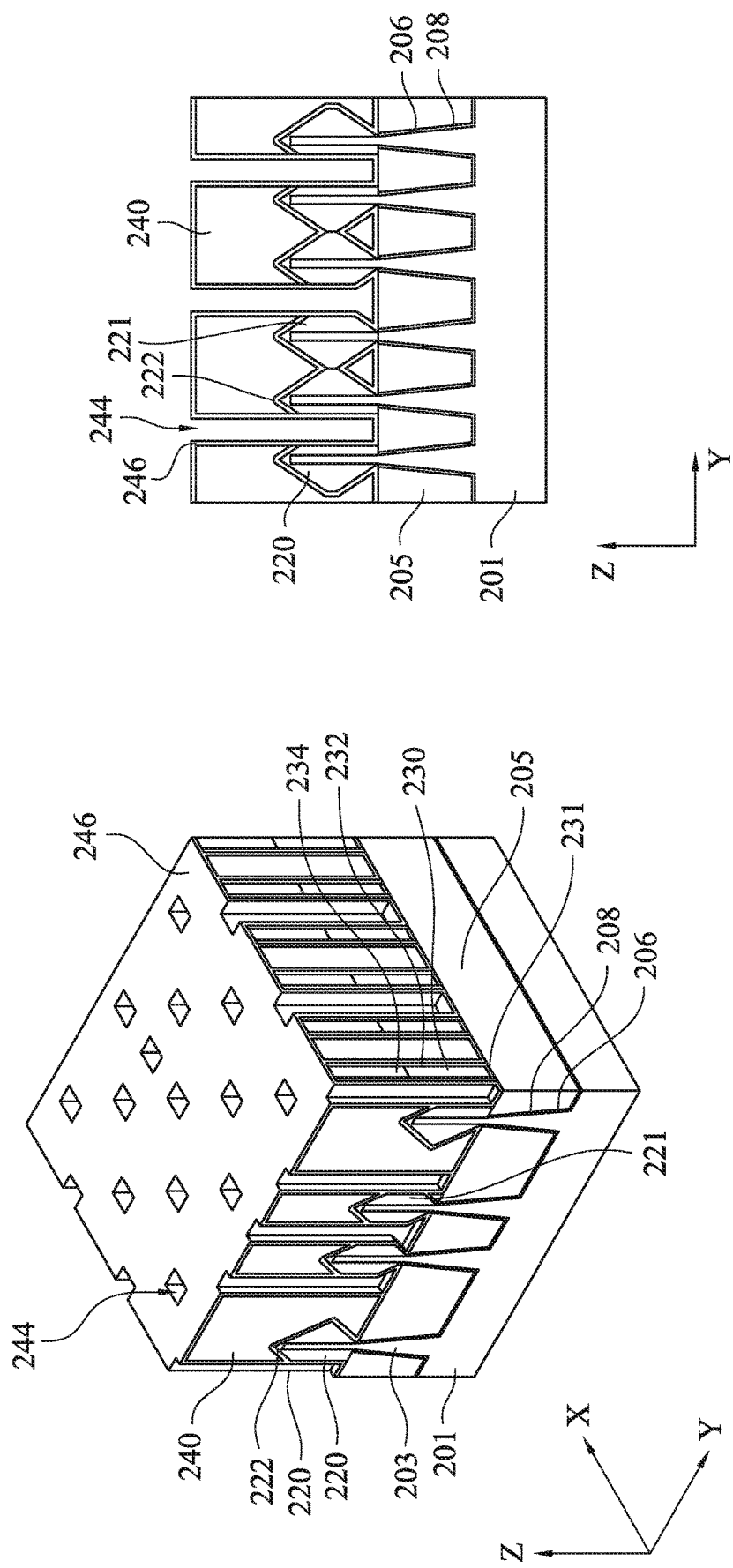
FIGS. 15A and 15B illustrate one of the various stages of a semiconductor device fabrication process in accordance with one or more embodiments of the present disclosure.

FIGS. 15A and 15B show exemplary views of one of the various stages for manufacturing a FinFET device according to some embodiments of the present disclosure. FIG. 15A is a perspective view and FIG. 15B is a cross sectional view corresponding to line Y23-Y23 of FIGS. 10A and 10B.

Similar to FIGS. 6A-6C, after the mask pattern 242 is removed, a second insulating layer 246 is formed over the patterned second sacrificial layer 240 and the patterned S/D structures 220 and 221. As shown in FIGS. 15A and 15B, the second insulating layer 246 is formed also on the sidewall spacers 232 and the gate cap layer 234. In some embodiments, a silicide layer is not formed on the patterned S/D structures at this stage of the manufacturing operations. In other embodiments, a silicide layer is formed on the patterned S/D structures before forming the second insulating layer.

Figures 16A, 16B:
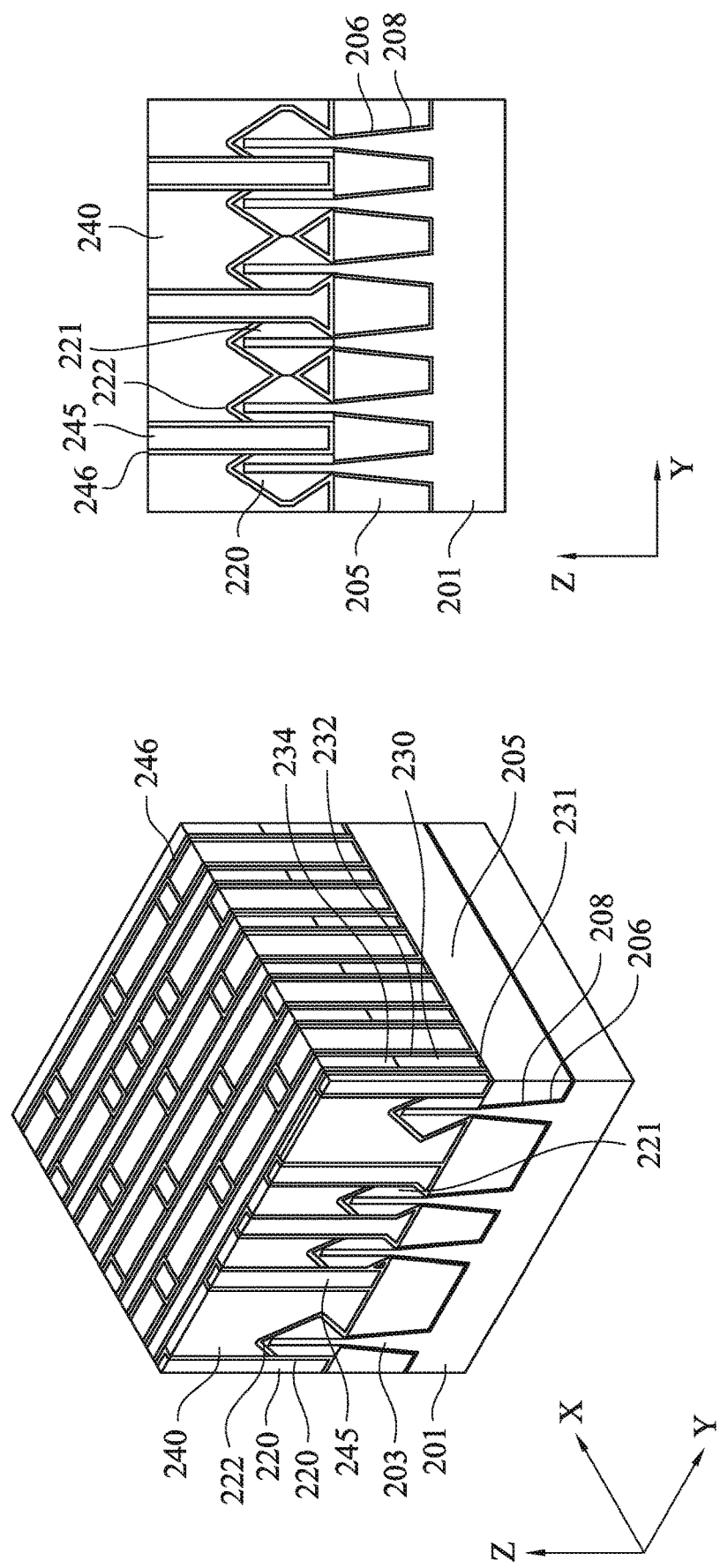
FIGS. 16A and 16B illustrate one of the various stages of a semiconductor device fabrication process in accordance with one or more embodiments of the present disclosure.

FIGS. 16A and 16B show exemplary views of one of the various stages for manufacturing a FinFET device according to some embodiments of the present disclosure. FIG. 16A is a perspective view and FIG. 16B is a cross sectional view corresponding to line Y23-Y23 of FIGS. 10A and 10B.

Similar to FIGS. 7A-7C, after the second insulating layer 246 is formed, a first interlayer dielectric (ILD) layer 245 is formed to fill the openings 244 and to cover the second sacrificial layer 240 and the S/D structures. A planarization process, such as a CMP process, is performed to remove excess materials for the ILD layer 245 and part of the second insulating layer 246. By the planarization process, the upper surface of the second sacrificial layer 240 (and the cap insulation layer 234) is exposed in some embodiments.

Figures 17A, 17B:
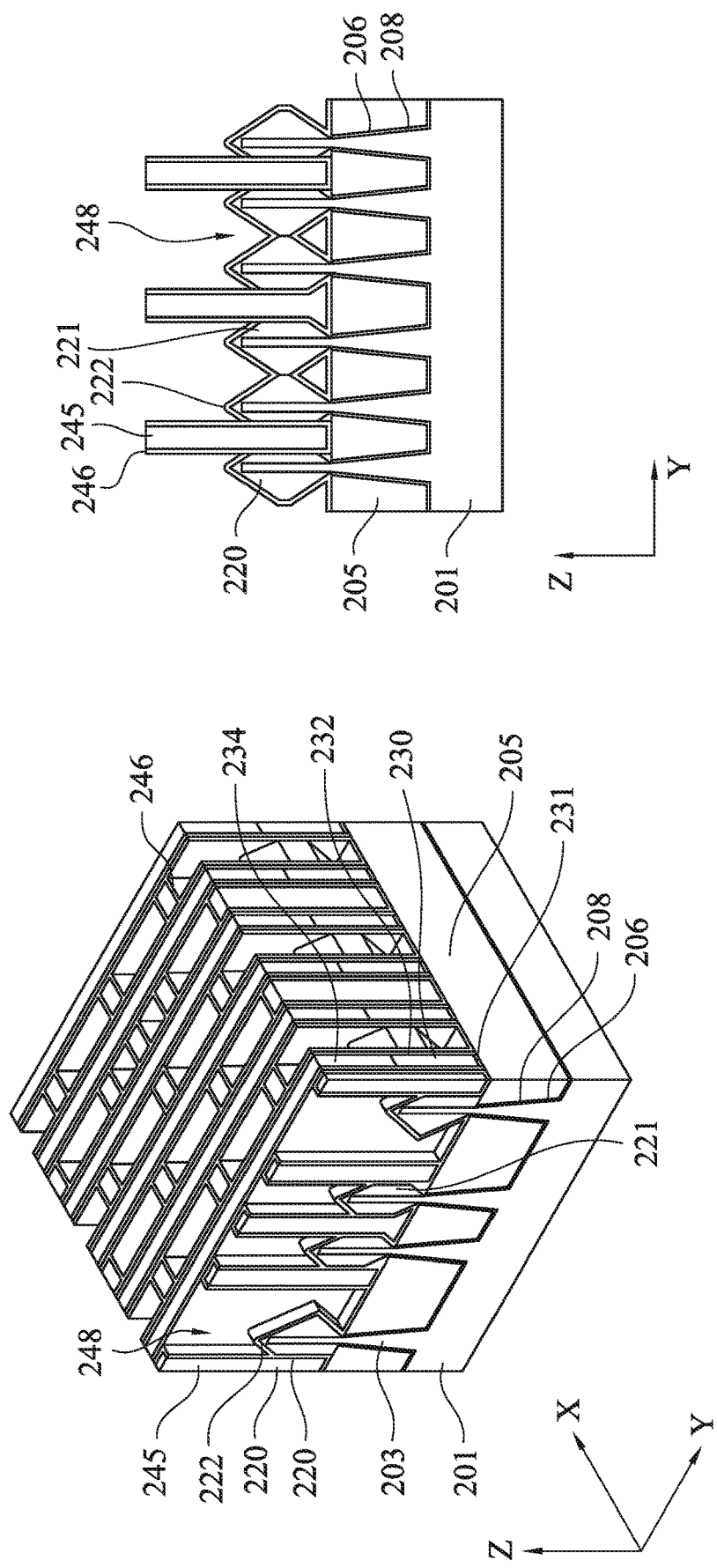
FIGS. 17A and 17B illustrate one of the various stages of a semiconductor device fabrication process in accordance with one or more embodiments of the present disclosure.

FIGS. 17A and 17B show exemplary views of one of the various stages for manufacturing a FinFET device according to some embodiments of the present disclosure. FIG. 17A is a perspective view and FIG. 17B is a cross sectional view corresponding to line Y23-Y23 of FIGS. 10A and 10B.

Similar to FIGS. 8A-8C, the second sacrificial layer 240 is removed.

Figure 18:
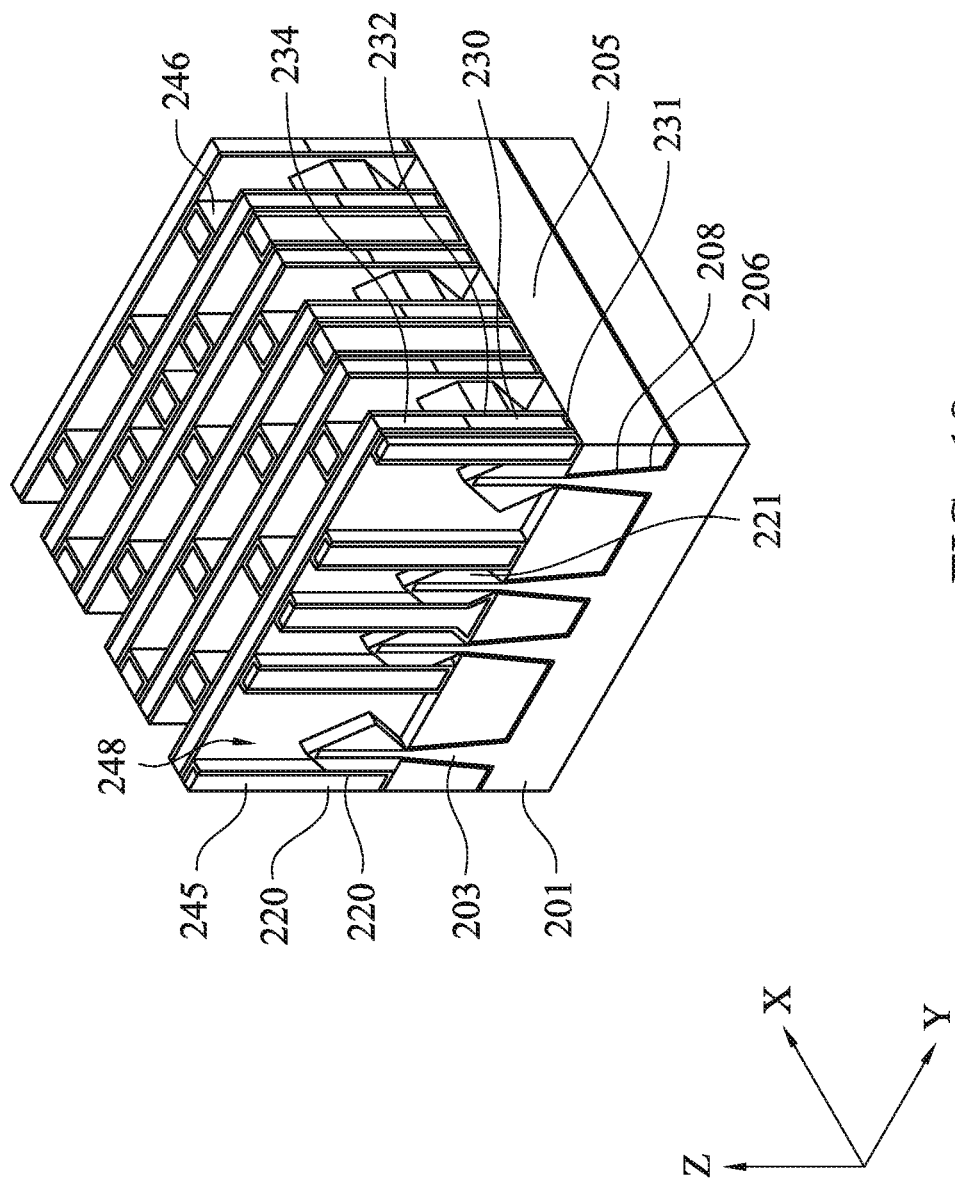
FIG. 18 illustrates one of the various stages of a semiconductor device fabrication process in accordance with one or more embodiments of the present disclosure.

FIG. 18 shows an exemplary view of one of the various stages for manufacturing a FinFET device according to some embodiments of the present disclosure.

Similar to FIGS. 8A-8C, after the second sacrificial layer 240 is removed, the first insulating layers 222 remaining on the top or sides of the S/D structures are removed, thereby forming contact openings 248. As shown in FIG. 18, each of the contact openings 248 is defined by the second insulating layer 246 and the sidewall spacers 232.

Figure 19:
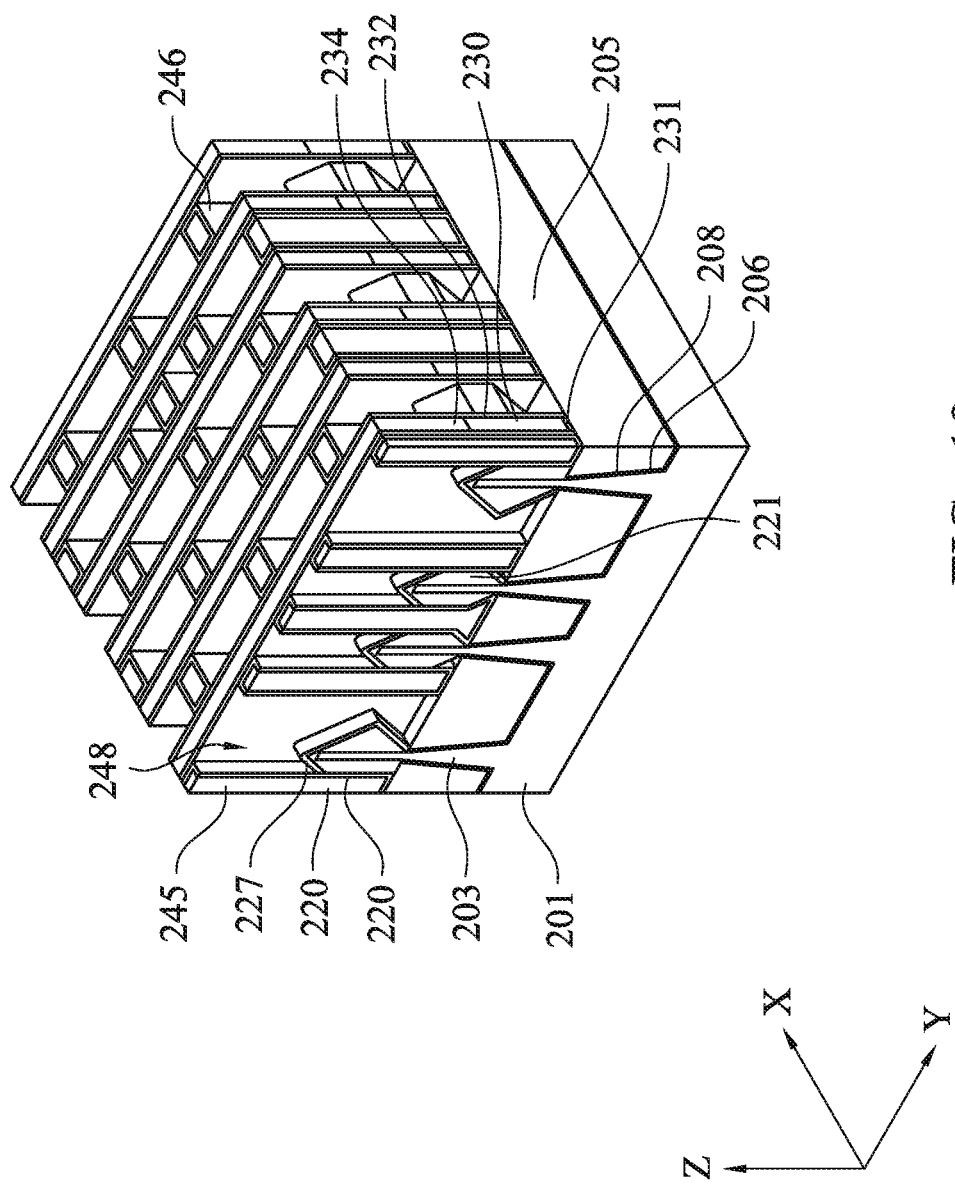
FIG. 19 illustrates one of the various stages of a semiconductor device fabrication process in accordance with one or more embodiments of the present disclosure.

FIG. 19 shows an exemplary view of one of the various stages for manufacturing a FinFET device according to the embodiments of the present disclosure.

Similar to FIGS. 9A-C, after the contact openings 248 are formed, silicide layers 227 are formed on the exposed top and sides of the S/D structures 220 and 221.

Figure 20:
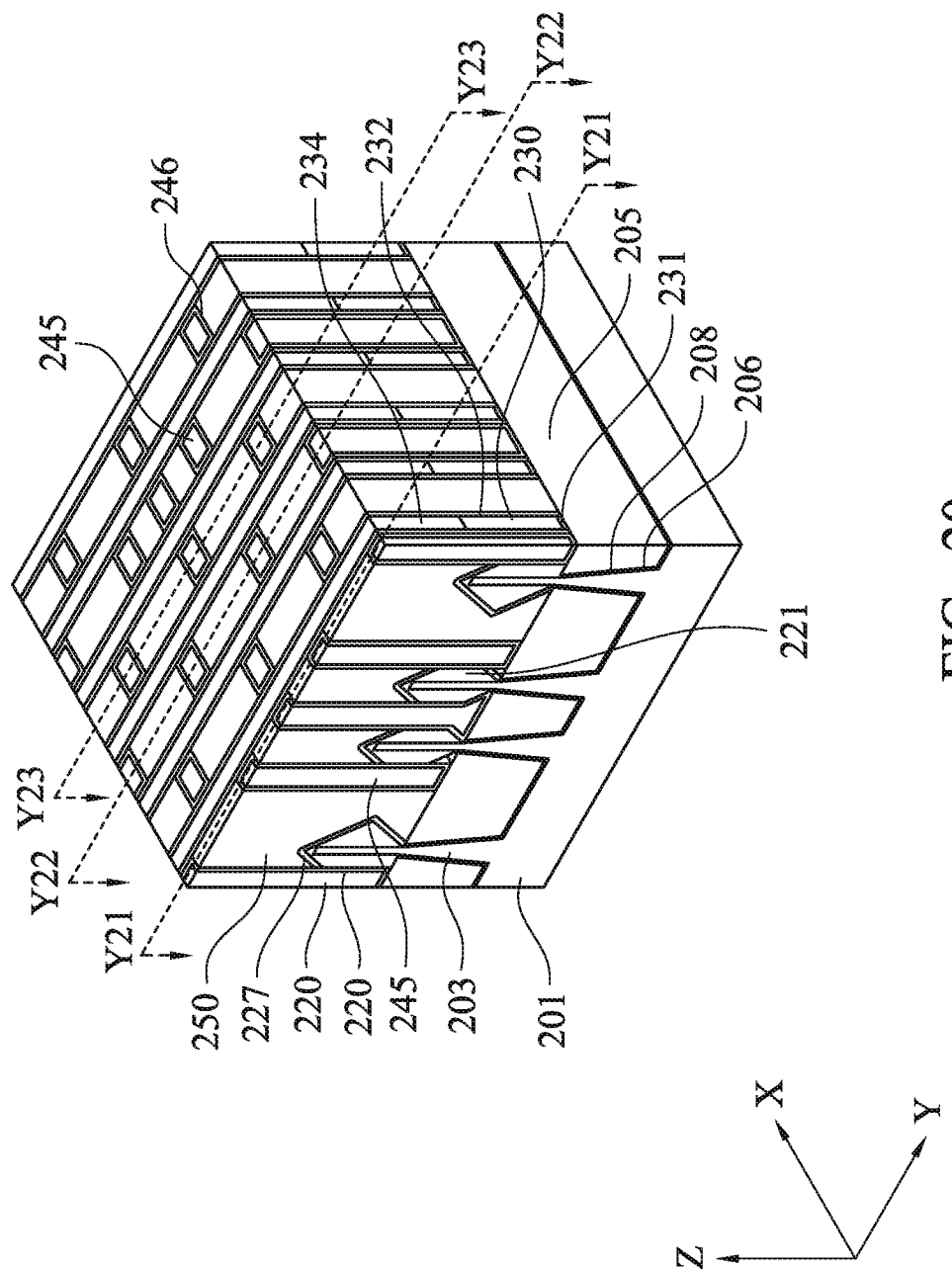
FIG. 20 illustrates one of the various stages of a semiconductor device fabrication process in accordance with one or more embodiments of the present disclosure.

FIG. 20 shows an exemplary view of one of the various stages for manufacturing a FinFET device according to some embodiments of the present disclosure.

Similar to FIGS. 9A-C, contacts 250 are formed in the contact openings 248 to contact the silicide layers 227 formed on the top and sides of the S/D structures.

After forming the contacts 250, further CMOS processes are performed to form various features such as additional interlayer dielectric layers, contacts/vias, interconnect metal layers, and passivation layers, etc.

Figure 21B:
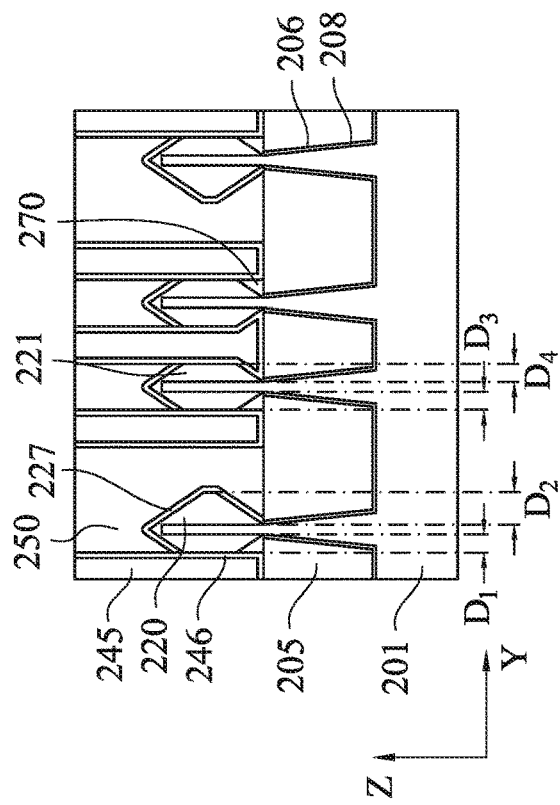
FIGS. 21A-21D illustrate one of the various stages of a semiconductor device fabrication process in accordance with one or more embodiments of the present disclosure.
Figure 21D:
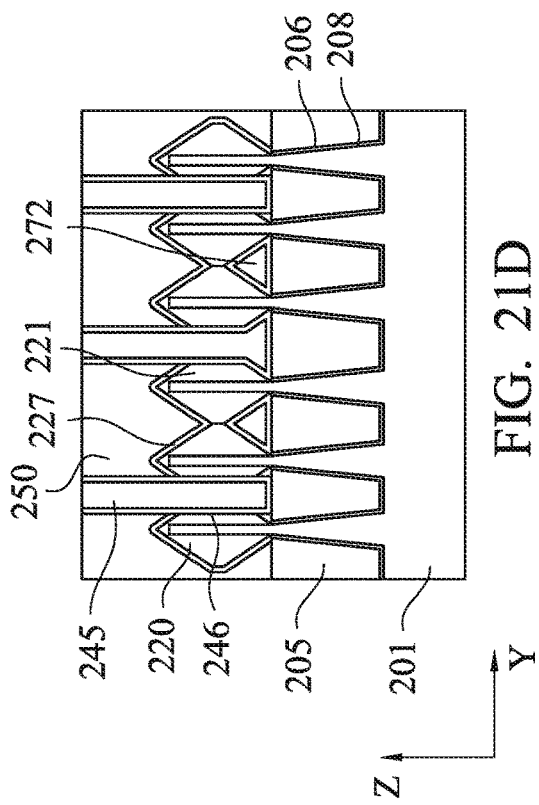
Figure 21A:
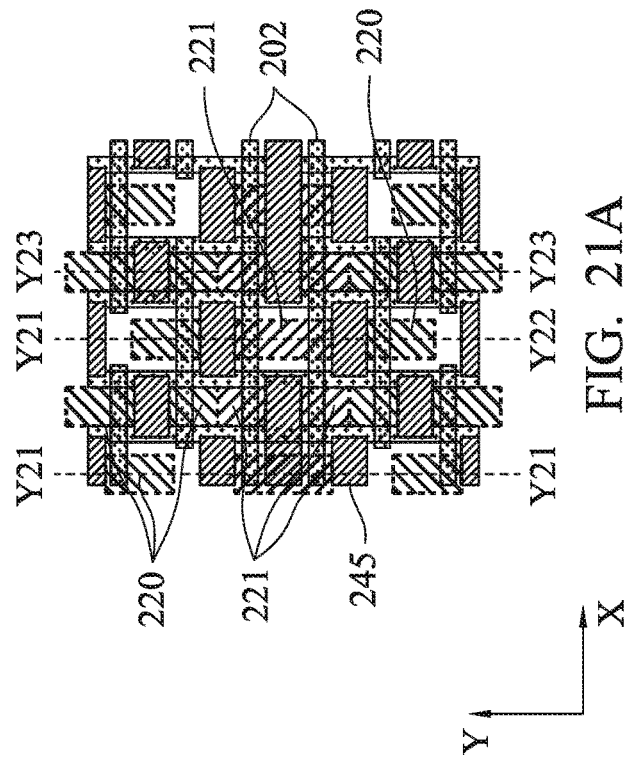
Figure 21C:
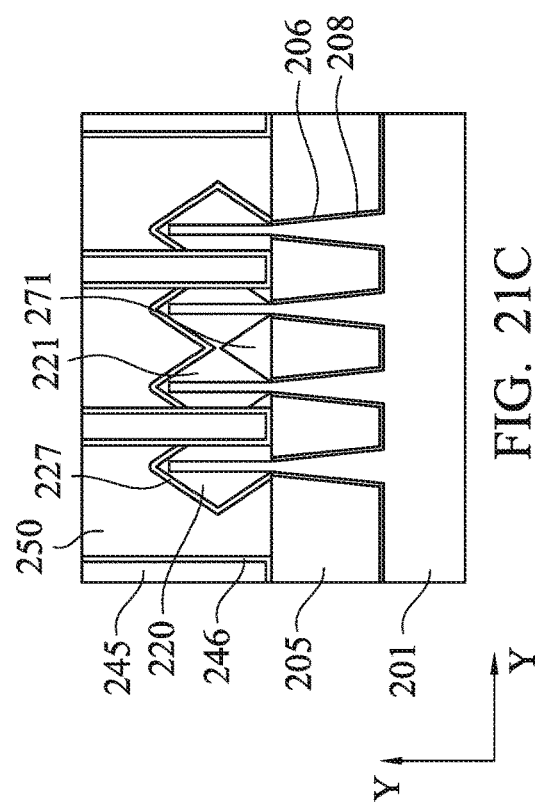

FIG. 21A illustrates a plan view of SRAM cells after the contacts are formed. FIGS. 21B-21D are cross sectional views corresponding to lines Y21-Y21, Y22-Y22 and Y23-Y23 of FIGS. 20 and 21A, respectively. It is noted that FIG. 21A shows only fin structures 202, gates 230, and the S/D structures 220 and 221.

In FIG. 21B, only one of the side portions of the epitaxial layer of the first conductivity type S/D structures 220 has an etched surface, while both sides of the epitaxial layer of the second conductivity type S/D structures 221 have etched surfaces. Accordingly, the first conductivity type S/D structures 220 has an asymmetric cross section with respect to the fin structure 204 along the Y direction. The distance $D_1$ between the etched surface and the fin structure 204 at one side is about 10% to about 70% of the distance $D_2$ between non-etched surface (farthest point from the fin structure) and the fin structure 204 at the other side, in some embodiments. In other embodiments, the distance $D_1$ is about 20% to about 50% of the distance $D_2$.

The second conductivity type S/D structures 221 has a substantially symmetric cross section with respect to the fin structure 204 along the Y direction. However, by process variations, such as overlay errors in photo lithography operations, the second conductivity type S/D structures 221 may have a slightly asymmetric cross section. In such a case, the distance $D_3$ between the etched surface and the fin structure 204 at one side is about 60% to about 140% of the distance $D_4$ between the etched surface and the fin structure 204 at the other side, in some embodiments. In other embodiments, the distance $D_3$ is about 90% to about 110% of the distance $D_4$.

In FIG. 21C, similar to FIG. 21B, only one of the side portions of the epitaxial layer of the first conductivity type S/D structures 220 has an etched surface. The epitaxial layers of the second conductivity type S/D structures 221 are merged on one sides, while the other sides have etched surfaces.

In FIG. 21D, this cross section includes first conductivity S/D structures 220 in which only one of the side portions of the epitaxial layer has an etched surface, first conductivity S/D structures 220 merged with adjacent second conductivity S/D structures 220, in which each of the first conductivity S/D structures 220 and the second conductivity S/D structures 220 have an etched surface.

It is noted that as shown in FIGS. 21B-21D, voids 270, 271 and 272 may be formed under the S/D structures.

As set forth above, the S/D structures shown by FIGS. 21B-21D may exist in one semiconductor device, e.g., an SRAM. The structure shown by FIGS. 9A-9C may be included in the same semiconductor device. Further, the same semiconductor device may also include S/D structures having no etched surface, similar to the structures shown in FIGS. 10C-10E.

Figure 22A:
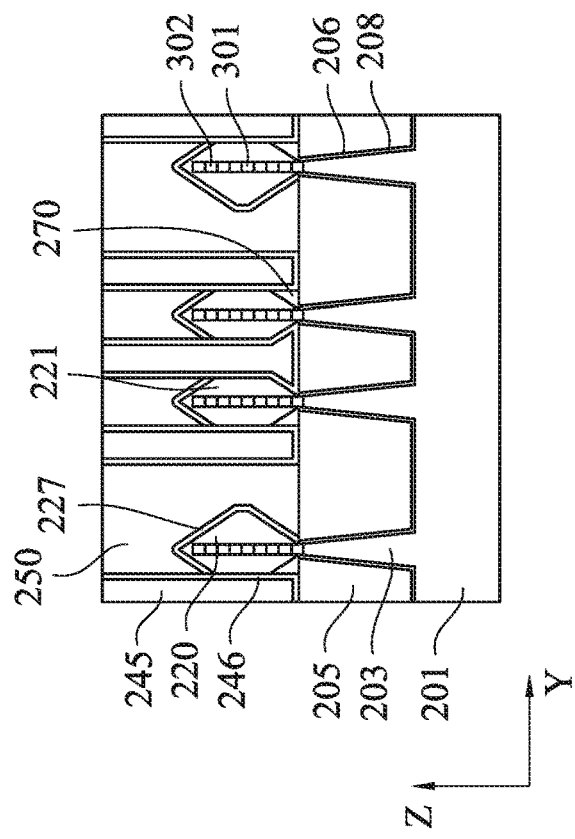
FIGS. 22A and 22B illustrate exemplary cross sectional views of a semiconductor device in accordance with some embodiments of the present disclosure.
Figure 22B:
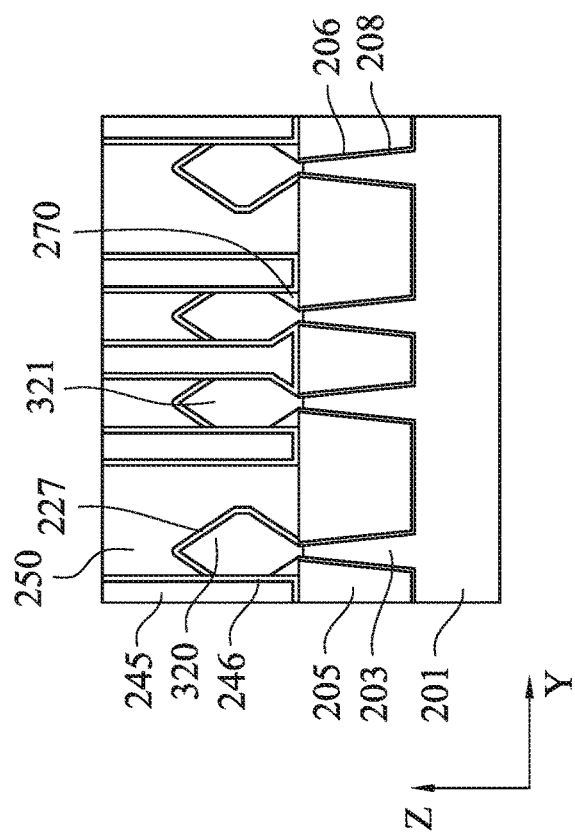

FIGS. 22A and 22B illustrate exemplary cross sectional views of a semiconductor device in accordance with other embodiments of the present disclosure.

In the foregoing embodiments, one or more epitaxial layers are formed on the upper portion of the fin structure 104 or 204 as an S/D structure 120, 220 or 221. In the embodiment shown in FIG. 22A, the one or more epitaxial layers are formed such that the upper portion of the fin structure 104 or 204 is recessed down to or below the upper surface of the ILD 205, and then one or more epitaxial layers 320 or 321 are formed on the recessed fin structures.

In FIG. 22B, fin structure 104 or 204 is replaced with a stacked layer of first semiconductor layers 301 and second semiconductor layers 302 for a gate-all-around FET, in which the channels of the FET are nano-wires of either the first semiconductor layers or the second semiconductor layers, each of which is wrapped with a gate dielectric layer and a gate electrode.

FIGS. 23-28 illustrate various stages of a semiconductor device fabrication process in accordance with one or more embodiments of the present disclosure. It is understood that additional operations can be provided before, during, and after processes shown by FIGS. 23-28, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-22B may be employed in the following embodiments, and detailed explanation thereof may be omitted.

Figure 23:
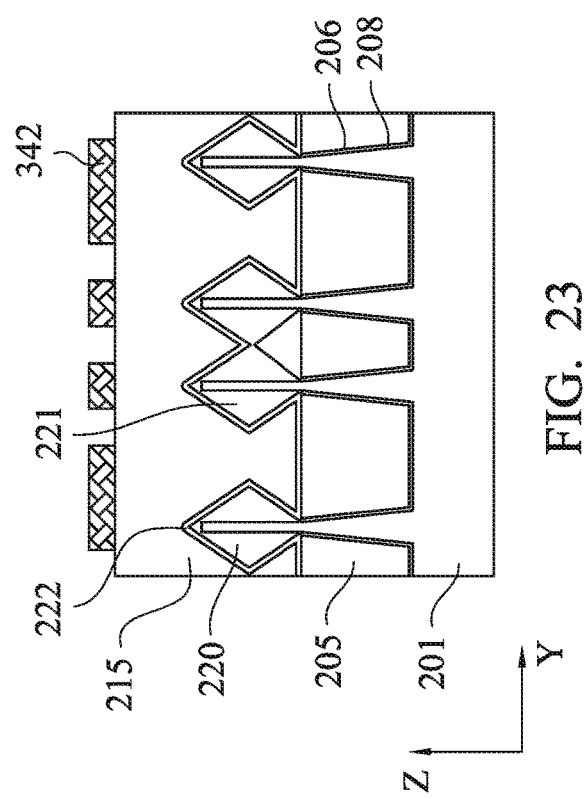
FIG. 23 illustrates one of the various stages of a semiconductor device fabrication process in accordance with one or more embodiments of the present disclosure.

After the structure shown in FIGS. 10A-10E is formed, a mask pattern 342 is formed on the first sacrificial layer 215, as shown in FIG. 23. The mask pattern 342 is made of a different material than the first sacrificial layer 215 and includes one or more layers of one or more layers of $SiO_2$, SiCN, SiON, $Al_2O_3$, SiN, TIN, TaN, $TiO_2$, Si, Ge, SiGe, SiC or other suitable materials. In some embodiments, multiple patterning operations using two or more mask layers are used to form the mask pattern.

Figure 24:
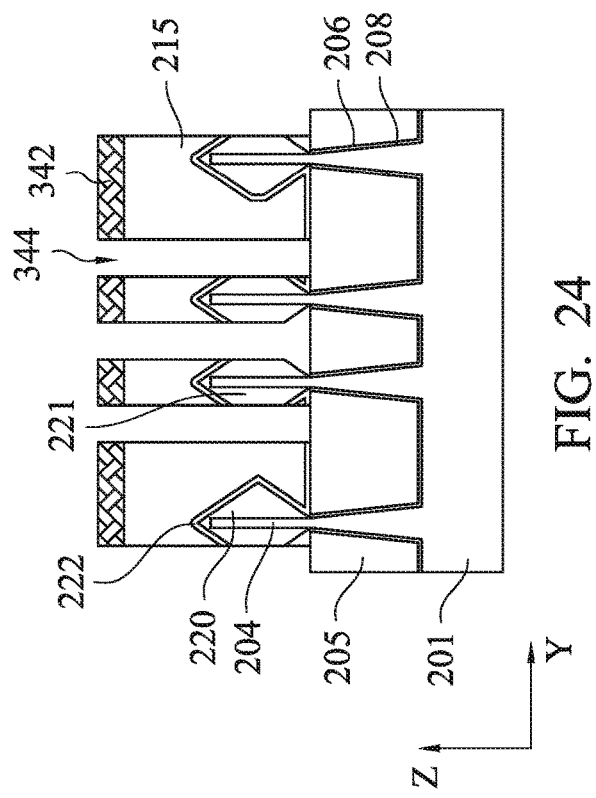
FIG. 24 illustrates one of the various stages of a semiconductor device fabrication process in accordance with one or more embodiments of the present disclosure.

By using the mask pattern 342 as an etching mask, the first sacrificial layer 215, the first insulating layer 222 and the S/D structures 220 and 221 are anisotropically etched, thereby forming openings 344, which separate adjacent S/D structures, as shown in FIG. 24. In some embodiments, multiple etching operations are performed. For example, an initial etching operation etches the first sacrificial layer 215 and stops on the first insulating layer 222. The subsequent etching operation(s) etches the first sacrificial layer 215 and the epitaxial layers of the S/D structures. The etching masks for the initial etching and the subsequent etching may be the same (using the same layer of the mask pattern) or different (using different layers of the mask pattern).

By the etching operations, at least one of the side portions of the S/D structures 220 and 221 are removed, such that the etched side surfaces of the S/D structures 220 and 221 are substantially parallel to the side surfaces of the upper fin structures 204. The, the mask pattern 342 is removed by using a suitable etching operation and/or a planarization operation, such as CMP.

Figure 25:
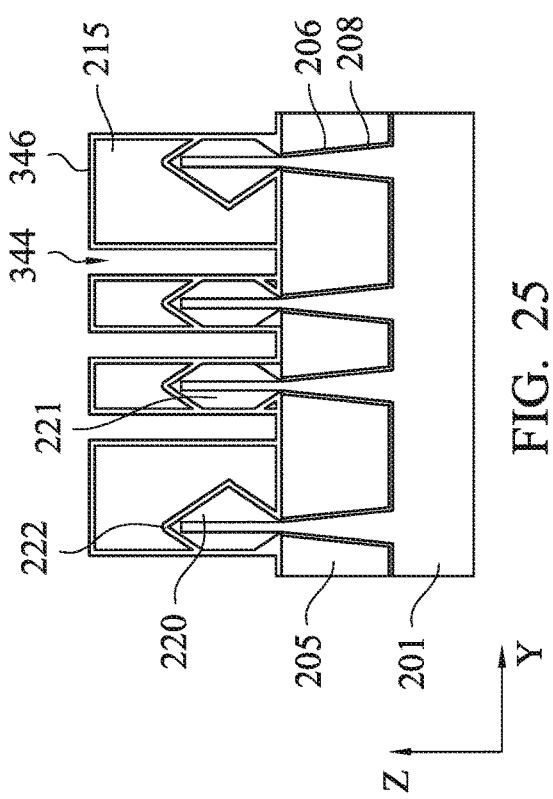
FIG. 25 illustrates one of the various stages of a semiconductor device fabrication process in accordance with one or more embodiments of the present disclosure.

After the mask pattern 342 is removed, a second insulating layer 346 is formed over the patterned first sacrificial layer 215 and the patterned S/D structures 220 and 221, as shown in FIG. 25.

Figure 26:
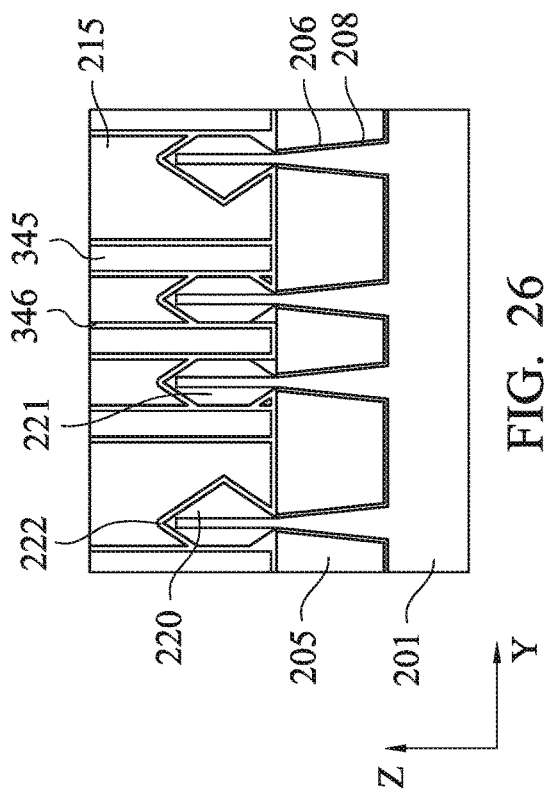
FIG. 26 illustrates one of the various stages of a semiconductor device fabrication process in accordance with one or more embodiments of the present disclosure.

After the second insulating layer 346 is formed, a first interlayer dielectric (ILD) layer 345 is formed to fill the openings 344 and to cover the first sacrificial layer 215 and the S/D structures. A planarization process, such as a CMP process, is performed to remove excess materials for the ILD layer 345 and part of the second insulating layer 346. By the planarization process, the upper surface of the first sacrificial layer 215 is exposed in some embodiments, as shown in FIG. 26.

Subsequently, the first sacrificial layer 215 is removed by using a suitable etching operation, thereby forming openings 348, as shown in FIG. 27. In some embodiments, a wet etching operation is used.

After the first sacrificial layer 215 is removed, the first insulating layers 222 remaining on the top or sides of the S/D structures are removed, thereby exposing the S/D structures, silicide layers 227 are formed on the exposed top and sides of the S/D structures 220 and 221. Subsequently, contacts 250 are formed to contact the silicide layers 227 formed on the top and sides of the S/D structures.

After forming the contacts 250, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, once merged epitaxial layers of the source/drain structure due to a narrow separation of adjacent fin structures are separated by the later patterning operations, and thus it is possible to reduce the device area without causing a short-circuit problem between adjacent FinFETs. In addition, since a material having a higher etching selectivity (e.g., Si) is used as the second sacrificial layer in the separation patterning, it is possible to more precisely control the size of the after-etched S/D structures.

In accordance with an aspect of the present disclosure, in a method of forming a semiconductor device including a fin field effect transistor (FinFET), a sacrificial layer is formed over a source/drain structure of a FinFET structure and an isolation insulating layer. A mask pattern is formed over the sacrificial layer. The sacrificial layer and the source/drain structure are patterned by using the mask pattern as an etching mask, thereby forming openings adjacent to the patterned sacrificial layer and source/drain structure. A dielectric layer is formed in the openings. After the dielectric layer is formed, the patterned sacrificial layer is removed to form a contact opening over the patterned source/drain structure. A conductive layer is formed in the contact opening.

In accordance with another aspect of the present disclosure, in a method of forming a semiconductor device including fin field effect transistors (FinFETs), a sacrificial layer is formed over a first source/drain structure of a first FinFET structure, a second source/drain structure of a second FinFET structure and an isolation insulating layer. The first source/drain structure and the second source/drain structure are merged. A mask pattern is formed over the sacrificial layer. The sacrificial layer and the first and second source/drain structures are patterned by using the mask pattern as an etching mask, thereby separating the first and second source/drain structures and forming openings adjacent to the patterned sacrificial layer and the patterned first and second source/drain structures. A dielectric layer is formed in the openings. After the dielectric layer is formed, the patterned sacrificial layer is removed to form contact openings over the patterned first and second source/drain structures, respectively. Conductive layers are formed in the contact openings.

In accordance with another aspect of the present disclosure, a semiconductor device including fin field effect transistors (FinFETs), includes a first FinFET including a first fin structure extending in a first direction and a first source/drain structure, a second FinFET disposed adjacent to the first FinFET and including a second fin structure extending in the first direction and a second source/drain structure, and a dielectric layer separating the first source/drain structure and the second source/drain structure. The first source/drain structure is asymmetric with respect to the first fin structure in a cross section along a second direction crossing the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device including a fin field effect transistor (FinFET) of a first conductivity type, the method comprising:
    forming a sacrificial layer over a source/drain structure of a FinFET structure and an isolation insulating layer;
    forming a mask pattern over the sacrificial layer;
    patterning the sacrificial layer and the source/drain structure by using the mask pattern as an etching mask, thereby forming openings adjacent to sides of the patterned sacrificial layer and sides of the patterned source/drain structure, and reducing a width of the source/drain structure;
    forming a dielectric layer in the openings;
    after the dielectric layer is formed, removing the patterned sacrificial layer to form a contact opening directly over the patterned source/drain structure; and
    forming a conductive layer in the contact opening.

2. The method of claim 1, wherein before the sacrificial layer is formed, a first insulating layer is formed over the source/drain structure and the isolation insulating layer.

3. The method of claim 1, wherein the sacrificial layer is made of one or more of Group IV elemental or compound materials.

4. The method of claim 1, wherein the sacrificial layer is made of one or more of silicon based or aluminum based dielectric material.

5. The method of claim 2, further comprising, after the sacrificial layer and the source/drain structure are patterned and before the dielectric layer is formed:
    forming a second insulating layer over the patterned sacrificial layer and source/drain structure.

6. The method of claim 5, further comprising, after the sacrificial layer and the source/drain structure are patterned and before the second insulating layer is formed:
    forming a silicide layer over the patterned source/drain structure.

7. The method of claim 5, wherein the sacrificial layer is made of a different material than the isolation insulating layer, the first insulating layer and the second insulating layer.

8. The method of claim 1, wherein:
    the source/drain structure includes a fin structure and one or more epitaxial layers formed on both opposing side faces and a top of the fin structure, and
    the source/drain structure is patterned such that the one or more epitaxial layers formed on at least one of the side faces are partially etched.

9. The method of claim 8, wherein the source/drain structure is patterned such that the one or more epitaxial layers formed on both of the side faces are partially etched.

10. The method of claim 1, wherein:
    the source/drain structure includes a fin structure embedded in the isolation insulating layer and one or more epitaxial layers formed on a top of the fin structure, and
    the source/drain structure is patterned such that the one or more epitaxial layers are partially etched.

11. The method of claim 1, wherein:
    the fin structure is protruding from an isolation insulating layer, and
    after the sacrificial layer and the source/drain structure are patterned, a surface of the isolation insulating layer is exposed.

12. A method of forming a semiconductor device including fin field effect transistors (FinFETs), the method comprising:
    forming a sacrificial layer over a first source/drain structure of a first FinFET structure, a second source/drain structure of a second FinFET structure and an isolation insulating layer, the first source/drain structure and the second source/drain structure being merged;
    forming a mask pattern over the sacrificial layer;
    patterning the sacrificial layer and the first and second source/drain structures by using the mask pattern as an etching mask, thereby separating the first and second source/drain structures, which are merged before separating, and forming openings adjacent to the patterned sacrificial layer and the patterned first and second source/drain structures;
    forming a dielectric layer in the openings;
    after the dielectric layer is formed, removing the patterned sacrificial layer to form contact openings over the patterned first and second source/drain structures, respectively; and
    forming conductive layers in the contact openings,
    wherein before the sacrificial layer is formed, a first insulating layer is formed over the merged first and second source/drain structures and the isolation insulating layer.

13. The method of claim 12, wherein the first source/drain structure has a same conductivity type as the second source/drain structure.

14. The method of claim 12, wherein the first source/drain structure has a different conductivity type than the second source/drain structure.

15. The method of claim 12, wherein the sacrificial layer is made of at least one of Si, SiGe and Ge.

16. The method of claim 12, wherein the sacrificial layer is made of at least one of SiOC, SiC, SiON, SiCN, SiOCN, SiN and $SiO_2$.

17. The method of claim 12, further comprising, after the sacrificial layer and the first and second source/drain structures are patterned and before the dielectric layer is formed:
    forming a second insulating layer over the patterned sacrificial layer and first and second source/drain structures.

18. The method of claim 17, wherein the sacrificial layer is made of a different material than the isolation insulating layer, the first insulating layer and the second insulating layer.

19. The method of claim 12, wherein:
    the first source/drain structure includes a first epitaxial layer, and the second source/drain structure includes a second epitaxial layer,
    the first epitaxial layer is merged with the second epitaxial layer, and
    the first and second source/drain structures are patterned such that the merged first and second epitaxial layers are separated.

20. A method of forming a semiconductor device, the method comprising:
    forming an epitaxial layer on a source/drain region of a fin structure;
    forming a sacrificial layer over the epitaxial layer;
    patterning the sacrificial layer and the epitaxial layer such that the patterned sacrificial layer is disposed on an uppermost portion of the patterned epitaxial layer and just above the source/drain region of the fin structure;
    forming an insulating layer over the patterned sacrificial layer and the patterned epitaxial layer;
    forming a dielectric layer over the insulating layer;
    after the dielectric layer is formed, removing the patterned sacrificial layer to form a contact opening directly over the patterned epitaxial layer such that the uppermost portion of the patterned epitaxial layer is exposed in the contact opening; and
    forming a conductive contact directly over the patterned epitaxial layer by filling the contact opening with a conductive material, wherein:
    the source/drain region of the fin structure protrudes from an isolation insulating layer, and
    after the sacrificial layer and the epitaxial layer are patterned, a surface of the isolation insulating layer is exposed and a width of the patterned epitaxial layer is reduced.

* * * * *